(12) United States Patent
Doyle et al.

(10) Patent No.: US 7,348,284 B2
(45) Date of Patent: Mar. 25, 2008

(54) NON-PLANAR PMOS STRUCTURE WITH A STRAINED CHANNEL REGION AND AN INTEGRATED STRAINED CMOS FLOW

(75) Inventors: Brian S Doyle, Portland, OR (US); Suman Datta, Portland, OR (US); Been-Yih Jin, Beaverton, OR (US); Nancy M Zelick, Portland, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/915,780

(22) Filed: Aug. 10, 2004

(65) Prior Publication Data

US 2006/0033095 A1 Feb. 16, 2006

(51) Int. Cl.
*H01L 21/00* (2006.01)
(52) U.S. Cl. ............... 438/933; 257/E29.193
(58) Field of Classification Search ............... 438/154, 438/157, 158, 176, 199, 206, 212, 283, 752, 438/933; 257/192, 331, 369, 401, 616, 619, 257/E29.193
See application file for complete search history.

(56) References Cited

U.S. PATENT DOCUMENTS

| | | |
|---|---|---|
| 4,906,589 A | 3/1990 | Chao |
| 4,996,574 A | 2/1991 | Shirasaki et al. |
| 5,124,777 A | 6/1992 | Lee |
| 5,338,959 A | 8/1994 | Kim et al. |
| 5,346,839 A | 9/1994 | Sundaresan |
| 5,391,506 A | 2/1995 | Tada et al. |
| 5,466,621 A | 11/1995 | Hisamoto et al. |
| 5,545,586 A | 8/1996 | Koh |

(Continued)

FOREIGN PATENT DOCUMENTS

EP 0 623 963 A1 11/1994

(Continued)

OTHER PUBLICATIONS

Burenkov, A. et al., "Corner Effect in Double and Triple Gate FINFETs", European Solid-State Device Research, 2003 33rd Conference on Essderc Sep. '03, 2003, Piscataway, NJ, USA, IEEE, pp. 135-138, XP010676716.

(Continued)

*Primary Examiner*—David Vu
(74) *Attorney, Agent, or Firm*—Blakely, Sokoloff, Taylor & Zafman LLP

(57) ABSTRACT

A non-planar tri-gate p-MOS transistor structure with a strained channel region and a non-planar tri-gate integrated strained complimentary metal-oxide-semiconductor (CMOS) structure are described. A relaxed $Si_{1-x}Ge_x$ layer is formed on the silicon-on-isolator (SOI) substrate. The relaxed $Si_{1-x}Ge_x$ layer is patterned and subsequently etched to form a fin on the oxide. The compressively stressed $Si_{1-y}Ge_y$ layer, having the Ge content y higher than the Ge content x in the relaxed $Si_{1-x}Ge_x$ layer, is epitaxially grown on the fin. The $Si_{1-y}Ge_y$ layer covers the top and two sidewalls of the fin. The compressive stress in the $Si_{1-y}Ge_y$ layer substantially increases the hole mobility in a channel of the non-planar tri-gate p-MOS transistor structure.

10 Claims, 14 Drawing Sheets

U.S. PATENT DOCUMENTS

| | | | |
|---|---|---|---|
| 5,563,077 A | 10/1996 | Ha | |
| 5,578,513 A | 11/1996 | Maegawa | |
| 5,595,919 A | 1/1997 | Pan | |
| 5,658,806 A | 8/1997 | Lin et al. | |
| 5,701,016 A | 12/1997 | Burroughes et al. | |
| 5,716,879 A | 2/1998 | Choi et al. | |
| 5,793,088 A | 8/1998 | Choi et al. | |
| 5,804,848 A | 9/1998 | Mukai | |
| 5,814,895 A | 9/1998 | Hirayama et al. | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,888,309 A | 3/1999 | Yu | |
| 5,899,710 A | 5/1999 | Mukai | |
| 5,905,285 A | 5/1999 | Gardner et al. | |
| 6,018,176 A | 1/2000 | Lim | |
| 6,066,869 A | 5/2000 | Noble et al. | |
| 6,163,053 A | 12/2000 | Kawashima | |
| 6,252,284 B1 | 6/2001 | Muller et al. | |
| 6,307,235 B1 | 10/2001 | Forbes et al. | |
| 6,376,317 B1 | 4/2002 | Forbes et al. | |
| 6,383,882 B1 | 5/2002 | Lee et al. | |
| 6,396,108 B1 | 5/2002 | Krivokapic et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,459,123 B1 | 10/2002 | Enders et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,483,156 B1 | 11/2002 | Adkisson et al. | |
| 6,525,403 B2 | 2/2003 | Inaba et al. | |
| 6,562,665 B1 | 5/2003 | Yu | |
| 6,583,469 B1 | 6/2003 | Fried et al. | |
| 6,611,029 B1 | 8/2003 | Ahmed et al. | |
| 6,630,388 B2 | 10/2003 | Ishii et al. | |
| 6,635,909 B2 | 10/2003 | Clark et al. | |
| 6,642,090 B1 | 11/2003 | Fried et al. | |
| 6,645,797 B1 | 11/2003 | Buynoski et al. | |
| 6,657,259 B2 | 12/2003 | Fried et al. | |
| 6,680,240 B1 | 1/2004 | Maszara | |
| 6,689,650 B2 | 2/2004 | Gambino et al. | |
| 6,706,571 B1 | 3/2004 | Yu et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,690 B1 | 4/2004 | Wang et al. | |
| 6,730,964 B2 | 5/2004 | Horiuchi | |
| 6,756,657 B1 | 6/2004 | Zhang et al. | |
| 6,764,884 B1 | 7/2004 | Yu et al. | |
| 6,770,516 B2 | 8/2004 | Wu et al. | |
| 6,787,402 B1 | 9/2004 | Yu | |
| 6,790,733 B1 | 9/2004 | Natzle et al. | |
| 6,794,313 B1 | 9/2004 | Chang | |
| 6,794,718 B2 | 9/2004 | Nowak et al. | |
| 6,798,000 B2 | 9/2004 | Luyken et al. | |
| 6,800,910 B2 | 10/2004 | Lin et al. | |
| 6,803,631 B2 | 10/2004 | Dakshina-Murthy et al. | |
| 6,812,075 B2 | 11/2004 | Fried et al. | |
| 6,815,277 B2 | 11/2004 | Fried et al. | |
| 6,821,834 B2 | 11/2004 | Ando | |
| 6,833,588 B2 | 12/2004 | Yu et al. | |
| 6,835,614 B2 | 12/2004 | Hanafi et al. | |
| 6,835,618 B1 | 12/2004 | Dakshina-Murthy et al. | |
| 6,849,884 B2 | 2/2005 | Clark et al. | |
| 6,858,478 B2 | 2/2005 | Chau et al. | |
| 6,869,868 B2 | 3/2005 | Chiu et al. | |
| 6,884,154 B2 | 4/2005 | Mizushima et al. | |
| 6,885,055 B2 | 4/2005 | Lee | |
| 6,897,527 B2 | 5/2005 | Dakshina-Murthy et al. | |
| 6,921,982 B2 * | 7/2005 | Joshi et al. | 257/349 |
| 2002/0011612 A1 | 1/2002 | Hieda | |
| 2002/0036290 A1 | 3/2002 | Inaba et al. | |
| 2002/0081794 A1 | 6/2002 | Ito | |
| 2002/0166838 A1 | 11/2002 | Nagarajan | |
| 2002/0167007 A1 | 11/2002 | Yamazaki et al. | |
| 2003/0042542 A1 | 3/2003 | Maegawa et al. | |
| 2003/0057486 A1 | 3/2003 | Gambino et al. | |
| 2003/0067017 A1 | 4/2003 | Ieong et al. | |
| 2003/0085194 A1 | 5/2003 | Hopkins, Jr. | |
| 2003/0098488 A1 | 5/2003 | O'Keeffe et al. | |
| 2003/0102497 A1 | 6/2003 | Fried et al. | |
| 2003/0102518 A1 | 6/2003 | Fried et al. | |
| 2003/0111686 A1 | 6/2003 | Nowak | |
| 2003/0122186 A1 | 7/2003 | Sekigawa et al. | |
| 2003/0143791 A1 | 7/2003 | Cheong et al. | |
| 2003/0151077 A1 | 8/2003 | Mathew et al. | |
| 2003/0201458 A1 | 10/2003 | Clark et al. | |
| 2003/0227036 A1 | 12/2003 | Sugiyama et al. | |
| 2004/0031979 A1 | 2/2004 | Lochtefeld et al. | |
| 2004/0036118 A1 | 2/2004 | Abadeer et al. | |
| 2004/0036126 A1 | 2/2004 | Chau et al. | |
| 2004/0036127 A1 | 2/2004 | Chau et al. | |
| 2004/0061178 A1 | 4/2004 | Lin et al. | |
| 2004/0070020 A1 | 4/2004 | Fujiwara et al. | |
| 2004/0092062 A1 | 5/2004 | Ahmed et al. | |
| 2004/0092067 A1 | 5/2004 | Hanafi et al. | |
| 2004/0094807 A1 | 5/2004 | Chau et al. | |
| 2004/0110097 A1 | 6/2004 | Ahmed et al. | |
| 2004/0119100 A1 | 6/2004 | Nowak et al. | |
| 2004/0126975 A1 | 7/2004 | Ahmed et al. | |
| 2004/0145019 A1 | 7/2004 | Dakshina-Murthy et al. | |
| 2004/0180491 A1 | 9/2004 | Arai et al. | |
| 2004/0191980 A1 | 9/2004 | Rios et al. | |
| 2004/0195624 A1 | 10/2004 | Liu et al. | |
| 2004/0198003 A1 | 10/2004 | Yeo et al. | |
| 2004/0219780 A1 | 11/2004 | Ohuchi | |
| 2004/0227187 A1 | 11/2004 | Cheng et al. | |
| 2004/0238887 A1 | 12/2004 | Nihey | |
| 2004/0256647 A1 | 12/2004 | Lee et al. | |
| 2004/0262683 A1 | 12/2004 | Bohr et al. | |
| 2004/0262699 A1 | 12/2004 | Rios et al. | |
| 2005/0035415 A1 | 2/2005 | Yeo et al. | |
| 2005/0093154 A1 * | 5/2005 | Kottantharayil et al. | 257/745 |
| 2005/0118790 A1 | 6/2005 | Lee et al. | |
| 2005/0127362 A1 | 6/2005 | Zhang et al. | |
| 2005/0145941 A1 * | 7/2005 | Bedell et al. | 257/348 |
| 2005/0156171 A1 | 7/2005 | Brask et al. | |
| 2005/0184316 A1 | 8/2005 | Kim | |
| 2005/0224797 A1 | 10/2005 | Ko et al. | |
| 2005/0224800 A1 | 10/2005 | Lindert et al. | |
| 2005/0227498 A1 | 10/2005 | Furkawa | |
| 2005/0230763 A1 | 10/2005 | Huang et al. | |
| 2006/0014338 A1 | 1/2006 | Doris et al. | |

FOREIGN PATENT DOCUMENTS

| | | |
|---|---|---|
| EP | 1 202 335 A | 5/2002 |
| EP | 1 202 335 A2 | 5/2002 |
| EP | 1 566 844 A2 | 8/2005 |
| JP | 406177089 A | 6/1994 |
| JP | 2003-298051 | 10/2003 |
| JP | 2003298051 | 10/2003 |
| WO | WO 02/43151 A | 5/2002 |
| WO | WO 02/43151 A1 | 5/2002 |
| WO | WO 2004/059726 A | 7/2004 |
| WO | PCT/US2005/010505 | 3/2005 |

OTHER PUBLICATIONS

Chang, S.T. et al, "3-D Simulation of Strained Si/SiGe Heterojunction FinFETS", Semiconductor Device Research Symposium, 2003 International, Dec. 2003, Piscataway, NJ, USA, IEEE, pp. 176-177, XP010687197.

V. Subramanian et al., "A Bulk-Si-Compatible Ultrathin-body SOI Technology for Sub-100m MOSFETS" Proceeding of the 57th Annual Device Research Conference, pp. 28-29 (1999).

Hisamoto et al., "A Folded-channel MOSFET for Deep sub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

Hisamoto et al., "A Fully Depleted Lean-Channel Transistor (DELTA)-A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Tripe Gate FinFets", IEEE 2003, ppg 135-138.

S.T. Chang et al., "3-D Simulation of Strained Si/SiGe Heterojunction FinFETs", pp. 176-177.

International Search Report PCT/US2005/010505.

International Search Report PCT/US2005/020339.

International Search Report PCT/US 03/26242 (from P14435pct).

International Search Report PCT/US 03/39727 (from P15677pct).

International Search Report PCT/US 03/40320 (from P15685pct).

International Search Report PCT/US2005/000947 (from P17814pct).

Fried, David M. et al., High-Performance P-type Independent-Gate FinFETs, IEEE Electron Device Letters, vol. 25, No. 4, Apr. 2004, pp. 199-201.

Fried, David M. et al., "Improved Independent Gate N-Type FinFET Fabrication and Characterization", IEEE Electron Device Letters, vol. 24, No. 9, Sep. 2003, pp. 592-594.

Kuo, Charles et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

Kuo, Charles et al., "A Capacitorless Double-Gate DRAM Cell Design for High Density Applications", 2002 IEEE International Electron Devices Meeting Technical Digest, Dec. 2002, pp. 843-846.

Ohsawa, Takashi et al., "Memory Design Using a One-Transistor Gain Cell on SOI", IEEE Journal of Solid-State Circuits, vol. 37, No. 11, Nov. 2002, pp. 1510-1522.

Tanaka, T. et al., Scalability Study on a Capacitorless 1T-DRAM: From Single-Gate PD-SOI to Double-Gate FinDram, 2004 IEEE International Electron Devices Meeting Technical Digest, Dec. 2004, 4 pages.

T.M. Mayer et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

International Search Report PCT/US2005/035380 (from P18700PCT).

Yang-Kyu Choi, et al., "Sub-20nm CMOS FinFET Technologies", Department of Electrical Engineering and Computer Sciences, University of California, Berkeley, CA 94720, USA, email: ykchoi@eecs.berkeley.edu, Tel: +1-510-643-2558, pp. 19.1.1-19.1.4.

International Search Report PCT/US2005/033439, mailed Jan. 31, 2006 (7 pgs.) (from P19523PCT).

International Search Report PCT/US2005/037169, mailed Feb. 23, 2006 (11 pgs.) (from P19522PCT).

International Search Report PCT/US2004/032442, date of mailing Apr. 12, 2005 (5 pgs.) (from P16682PCT).

International Search Report PCT/US2004/032442, date of mailing Jun. 16, 2005 (10 pgs.) (from P16682PCT).

International Search Report & Written Opinion PCT/US2006/000378, mailed May 24, 2006 (11 pgs.) (from P17291PCT).

Ali Javey et al., "High-K Dielectrics for Advanced Carbon-Nanotube Transistors and Logic Gates", Advance Online Publication, Published online, Nov. 17, 2002 pp. 1-6.

Richard Martel et al., "Carbon Nanotube Field Effect Transistors for Logic Applications" IBM, T.J. Watson Research Center, 2001 IEEE, IEDM 01, pp. 159-162.

David M. Fried et al., "Improved Independent Gate N-Type FinFET Fabrication and Characterization", IEEE Electron Device Letters, vol. 24, No. 9, Sep. 2003, pp. 592-594.

David M. Fried et al., "Improved Independent Gate P-Type Independent-Gate FinFETs", IEEE Electron Device Letters, vol. 25, No. 4, Apr. 2004, pp. 199-201.

Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

Charles Kuo et al., "A Capacitorless Double-Gate DRAM Cell Design for High Density Applications", 2002 IEEE International Electron Devices Meeting Technical Digest, Dec. 2002, pp. 843-846.

Takashi Ohsawa et al., "Memory Design Using a One-Transistor Gain Cell on SOI", IEEE Journal of Solid-State Circuits, vol. 37, No. 11, Nov. 2002, pp. 1510-1522.

Huang et al., "Sub 50nm FinFet: PMOS", 1999 IEEE International Electron Device Meeting Technical Digets, (1999) pp. 67-70.

Auth et al., "Vertical, Fully-Depleted, Surroundings Gate MOSFETS on Sub 0.1um Thick Silicon Pillars", 1996 54th Annual Device Research Conference Digest, (1996) pp. 108-109.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

S.T. Chang et al., "3-D Simulation of Strained Si/SiGe Heterojunction FinFETs", pp. 176-177.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

T. Ludwig et al., "FinFET Technology for Future Microprocessors" 2003 IEEE, pp. 33-34. (from P16682PCT).

Ieong, M. et al., Three Dimensional CMOS Devices and Integrated Circuits, IEEE 2003 CICC, San Jose, CA, Sep. 21-24, 2003, pp. 207-214.

Nowak, E. J., et al., "Scaling Beyond the 65 nm Node with FinFET-DGCMOS", IEEE 2003 CICC, San Jose, CA, Sep. 21-24, 2003, pp. 339-342.

Jones, E. C., "Doping Challenges in Exploratory Devices for High Performance Logic", 14$^{TH}$ Int'l. Conference, Piscataway, NJ, Sep. 22-27, 2002, pp. 1-6.

Park, T. et al., "PMOS Body-Tied FinFET (Omega MOSFET) Characteristics", Device Research Conference, Piscataway, NJ, Jun. 23-25, 2003, IEEE Jun. 2003, pp. 33-34. (from P16682PCT).

Nowak, E. J., et al., "A Functional FinFET-DGCMOS SRAM Cell", Int'l. Electron Devices Meeting 2002, San Francisco, CA, Dec. 8-11, 2002, pp. 411-414.

Stolk, Peter A. et al., "Modeling Statistical Dopant Fluctuations in MOS Transistors", 1998 IEEE, IEEE Transactions on Electron Devices, vol. 45, No. 9, Sep. 1998, pp. 1960-1971. (from P16682PCT).

Seevinck, Evert et al., "Static-Noise Margin Analysis of MOS SRAM Cells" 1987 IEEE, IEEE Journal of Solid-State Circuits, vol. SC-22, No. 5, Oct. 1987. (from P16682PCT).

Choi , Yang-Kyu, et al., "Sub-20nm CMOS FinFET Technologies", IEEE 2001, IEDM 01-421 to 01-424.

V. Subramanian et al., "A Bulk-Si-Compatible Ultrathin-body SOI Technology for Sub-100nm MOSFETS" Proceeding of the 57th Annual Device Research Conference, pp. 28-29 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

S.T. Chang et al., "3-D Simulation of Strained Si/SiGe Heterojunction FinFETs", pp. 176-177, unknown date.

International Search Report PCT/US2005/010505, unknown date.

International Search Report PCT/US2005/020339, unknown date.

International Search Report PCT/US 03/26242 (from P14435pct), unknown date.

Yang-Kyu Choi, et al., "Sub-20nm CMOS FinFET Technologies", Department of Electrical Engineering and Computer Sciences, University of California, Berkeley, CA 94720, USA, email: ykchoi@eecs.berkeley.edu, Tel: +1-510-643-2558, pp. 19.1.1-19.1.4., unknown date.

T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).

V. Subramanian et al. "A Bulk Si-Compatible Ultrathin-Body SOI Technology for Sub-100nm MOSFETS", Proceedings of the 57th Annual Device Reach Conference, (1999) pp. 28-29.

Hisamoto et al. "A Folded-Channel MOSFET for Deep-sub-tenth Micron Era", 1998 IEEE International Electron Device Meeting Technical Digest, (1998) pp. 1032-1034.

Huang et al., "Sub 50nm FinFet: PMOS", 1999 IEEE International Electron Device Meeting Technical Digets, (1999) pp. 67-70.

Auth et al., "Vertical, Fully-Depleted, Surroundings Gate MOSFETS on Sub 0.1um Thick Silicon Pillars", 1996 54th Annual Device Research Conference Digest, (1996) pp. 108-109.

Hisamoto et al., "A Fully Depleted Lean-Channel Transistor (DELTA)-A Novel Vertical Ultrathin SOI MOSFET", IEEE Electron Device Letters, vol. 11 No. 1, (1990) pp. 36-38.

Jong-Tae Park et al., "Pi-Gate SOI MOSFET" IEEE Electron Device Letters, vol. 22, No. 8, Aug. 2001, pp. 405-406.

Digh Hisamoto et al., "FinFet-A Self Aligned Double-Gate MOSFET Scalable to 20nm", IEEE Transactions on Electron Devices, vol. 47, No. 12, Dec. 2000, pp. 2320-2325.

T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.

A. Burenkov et al., "Corner Effect in Double and Triple Gate FinFets", IEEE 2003, pp. 135-138.

S.T. Chang et al., "3-D Simulation of Strained Si/SiGe Heterojunction FinFETs", pp. 176-177, unknown date.

B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.

* cited by examiner

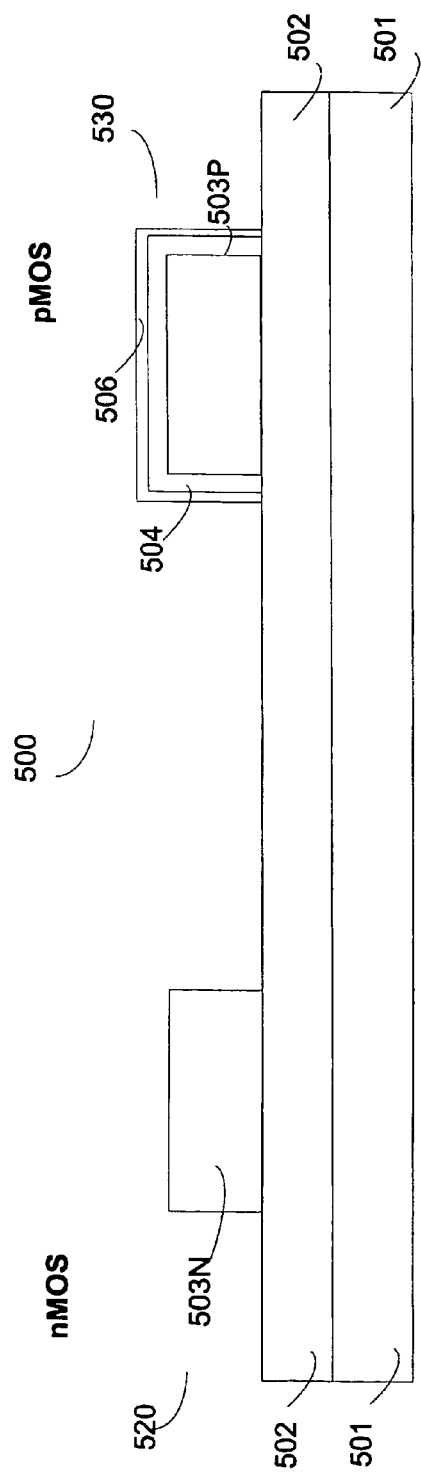
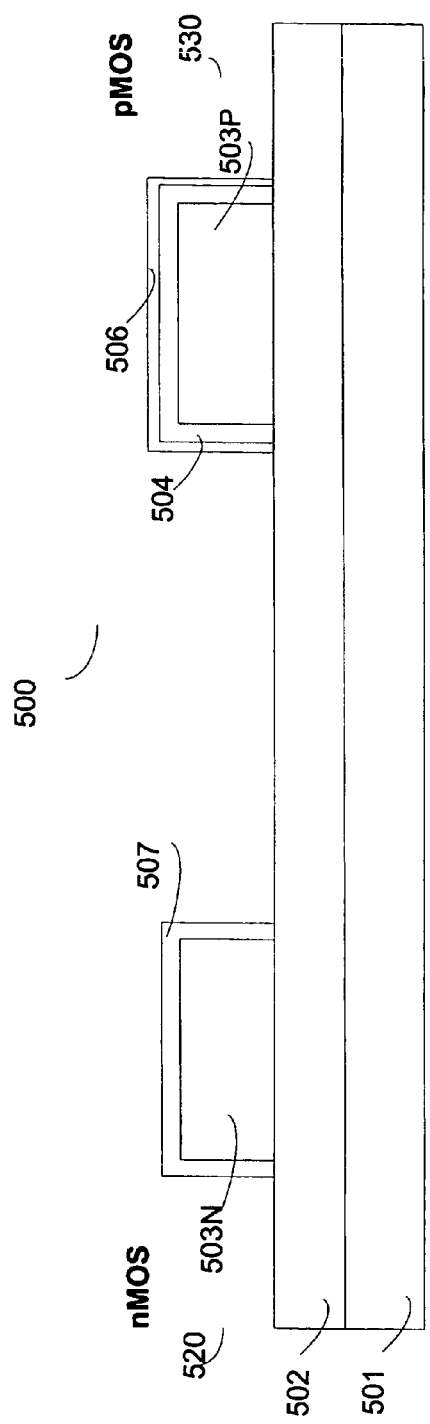
Fig. 2E
Fig. 2F

NON-PLANAR PMOS STRUCTURE WITH A STRAINED CHANNEL REGION AND AN INTEGRATED STRAINED CMOS FLOW

BACKGROUND OF THE INVENTION

1. Field of the Invention

This invention relates to the field of semiconductor manufacturing, and more specifically, to a semiconductor transistor and its manufacture.

2. Discussion of Related Art

Various techniques are used to improve performance of a metal-oxide-semiconductor (MOS) transistor. Transistors have continuously been scaled down, thus increasing their density, and accordingly, their switching speeds.

Another way to increase the speed of the transistor, is to create a transistor channel with a high mobility of the carriers by, for example, growing a strained silicon (Si) layer on a relaxed silicon germanium ("$Si_{1-x} Ge_x$") layer thereby increasing mobility of electrons. The tensile strain in the Si layer, however, does not increase the hole mobility. Therefore, for a p-MOS transistor structure, the channel formed from the Si layer under tensile stress cannot provide increased hole mobility. In addition, the tensile strained Si layer is grown on a planar substrate, which limits the density of the transistors and increases intrinsic capacitance.

BRIEF DESCRIPTION OF THE DRAWINGS

The invention is described by way of example with reference to the accompanying drawings, wherein:

FIG. 2E is a view similar to FIG. 2D, after removing the protection layer from the n-MOS portion of the semiconductor structure;

FIG. 2F is a view similar to FIG. 2E, after forming a strained Si layer on a tri-gate fin of the n-MOS portion of the semiconductor structure;

DETAILED DESCRIPTION OF THE INVENTION

A non-planar strained p-MOS transistor structure and a non-planar integrated strained complementary metal-oxide-semiconductor (CMOS) structure with respective processes of their fabrication are described herein. A relaxed $Si_{1-x} Ge_x$ layer is formed on the silicon-on-isolator (SOI) substrate. The relaxed $Si_{1-x} Ge_x$ layer is patterned, and subsequently, etched to form a tri-gate fin on the SOI substrate. Further, a $Si_{1-y} Ge_y$ layer, having a Ge content y higher than a Ge content x in the relaxed $Si_{1-x} Ge_x$ layer, is epitaxially formed on the tri-gate fin formed from the etched relaxed $Si_{1-x} Ge_x$ layer on the SOI substrate. The $Si_{1-y} Ge_y$ layer covers two opposing sidewalls and a top surface of the tri-gate fin. Due to the higher Ge content, the lattice of the $Si_{1-y} Ge_y$ layer has a larger spacing than the spacing of the lattice of the underlying relaxed $Si_{1-x} Ge_x$ layer. The larger spacing of the $Si_{1-y} Ge_y$ strains the $Si_{1-y} Ge_y$ layer, resulting in the compressive stress in the latter. A compressively stressed $Si_{1-y} Ge_y$ layer epitaxially grown on the top surface and the two opposing sidewalls of the tri-gate fin formed from the relaxed $Si_{1-x} Ge_x$ layer, which rests on the SOI substrate, is used to form a strained channel between a source and drain region of the non-planar p-MOS transistor structure. Compressive stress in $Si_{1-y} Ge_y$ layer substantially increases the hole mobility in the transistor channel of the non-planar p-MOS transistor structure improving current-voltage (I-V) characteristics. The I-V characteristics are improved, for example, by increasing a saturation drain current ($I_{DSAT}$) and a linear drain current ($I_{DLIN}$) of a non-planar p-MOS transistor, as a result of increased hole mobility in the transistor channel.

Figure 1A:
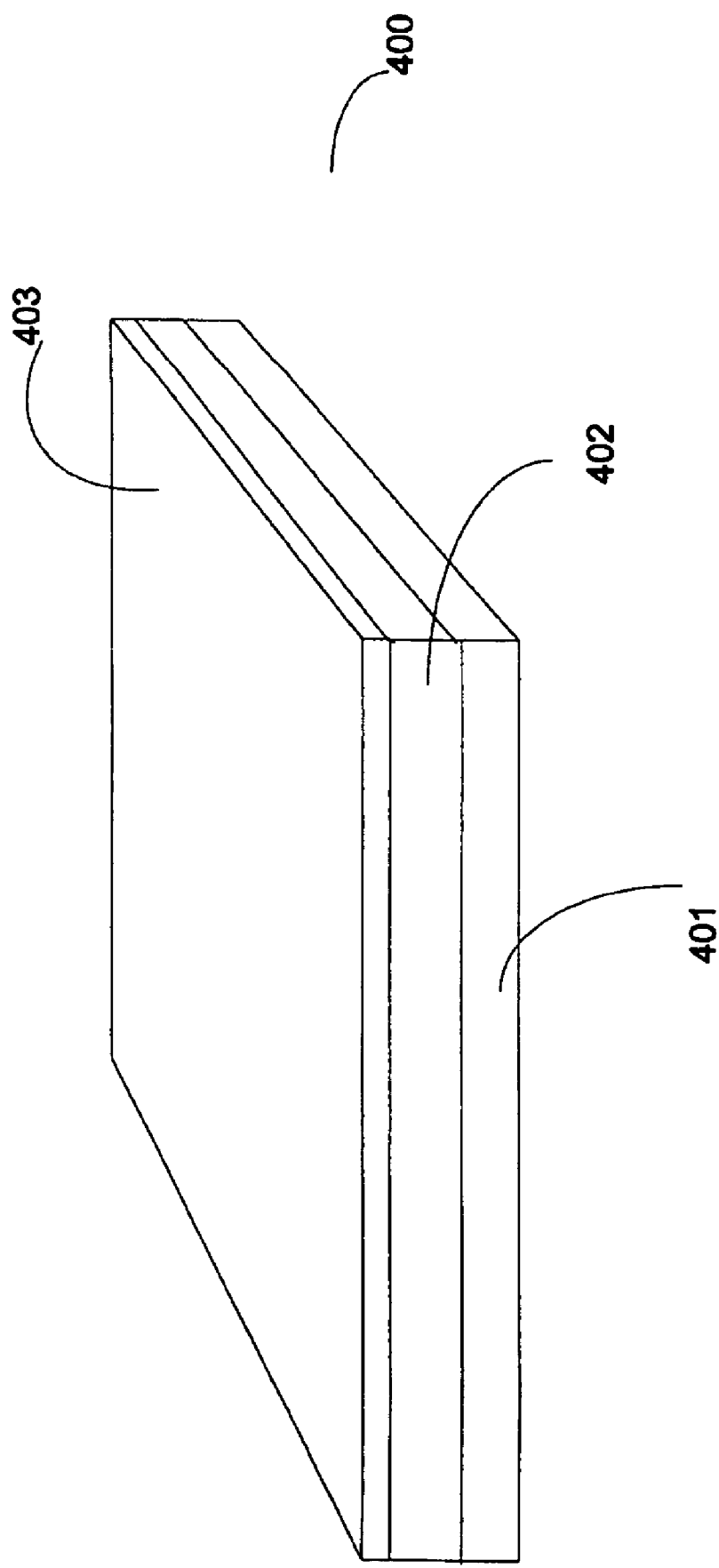
FIG. 1A is a perspective view of a semiconductor structure having a Silicon-On-Isolator (SOI) substrate for a non-planar strained p-MOS transistor structure fabrication according to one embodiment of the invention.

FIG. 1A of the accompanying drawings illustrates a semiconductor structure for a non-planar strained p-MOS transistor structure fabrication according to one embodiment of the invention. As shown in FIG. 1A, semiconductor structure 400 includes an insulating layer 402, which is sandwiched between a silicon layer 403 and a bulk monocrystalline silicon substrate 401 forming a silicon-on-isolator (SOI) substrate. Generally, devices are formed in and on the layer of silicon 403. The insulating layer 402 may serve to reduce capacitance between the devices formed in the silicon layer 403 and the substrate 401, resulting in less power consumption and greater circuit speed. In one embodiment, the insulating layer 402 is a buried oxide layer, for example, $SiO_2$, and the like. In alternative embodiments, the insulating layer 402 may be any one, or a combination of, sapphire, silicon dioxide, silicon nitride, or other insulating materials. The thickness of the silicon layer 403 may be in the approximate range of 2.5 nanometers ("nm") to 7.5 nm. The thickness of the insulating layer 402 may be in the approximate range of 500 angstroms ("Å") to 1500 Å. More specifically, the thickness of the silicon layer formed on top surface of the buried oxide layer resting on the monocrystalline Si substrate, is about 5 nm and the thickness of the buried oxide layer is about 1000 Å. The SOI substrate may be formed by any one of the techniques known in the art, for example, separation by implantation of oxygen (SIMOX), hydrogen implantation and separation approach (also called SmartCut®), and the like.

Figure 1B:
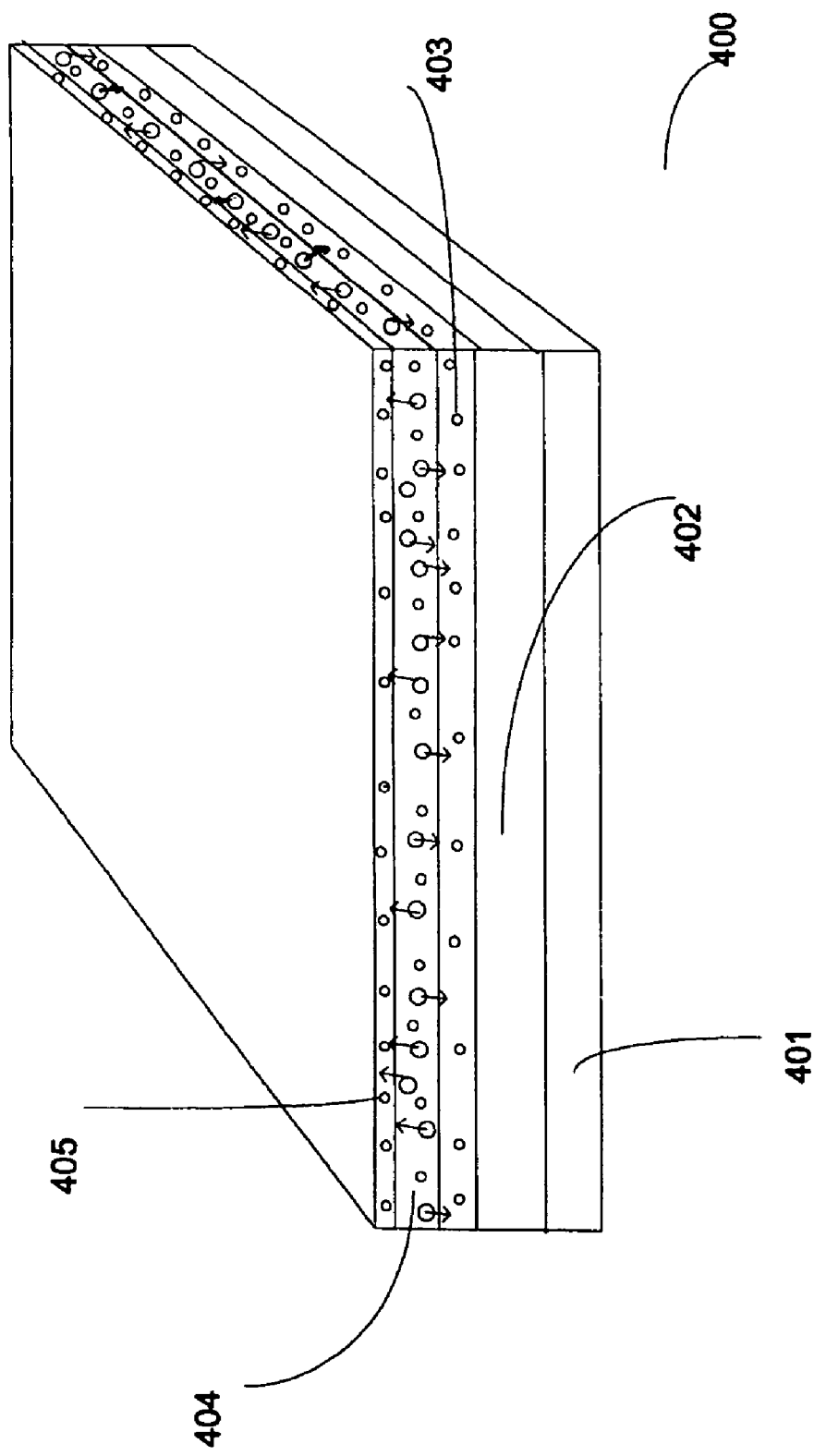
FIG. 1B is a view similar to FIG. 1A, after a strained $Si_{1-x} Ge_x$ layer and an intrinsic Si layer are formed on the SOI substrate.

FIG. 1B illustrates a semiconductor structure 400 after a strained $Si_{1-x}Ge_x$ layer and an intrinsic Si layer are formed on the SOI substrate. The strained $Si_{1-x}Ge_x$ layer 404 and an intrinsic Si layer 405 are subsequently formed on the Si layer 403. The $Si_{1-x}Ge_x$ layer 404 is epitaxially grown on the Si layer 403. Generally, $Si_{1-x}Ge_x$ material has a lattice structure substantially the same as a monocrystalline Si lattice structure. Because of the presence of Ge atoms, the $Si_{1-x}Ge_x$ lattice spacing is substantially larger than the Si lattice spacing. Ge atoms of the $Si_{1-x}Ge_x$ layer 404 are diagrammed as large circles, whereas Si atoms are diagrammed as small circles in FIG. 1B. The lattice spacing of the $Si_{1-x}Ge_x$ increases with increasing the Ge content x in the $Si_{1-x}Ge_x$. The larger lattice spacing strains the $Si_{1-x}Ge_x$ layer 404 formed on the Si layer 403 and generates the compressive stress in the $Si_{1-x}Ge_x$ layer 404. In one embodiment, an intrinsic Si layer 405 is epitaxially grown on the strained $Si_{1-x}Ge_x$ layer 404 to become a capping layer for the $Si_{1-x}Ge_x$ layer 404. In one embodiment, the Ge content x in the $Si_{1-x}Ge_x$ layer 404 formed on the Si layer 403 is in the approximate range of 0.05 to 0.2 (that is of 5% to 20%). In more specific embodiment, the Ge content x in the $Si_{1-x}Ge_x$ layer 404 on the Si layer 403 is about 0.15 that is equivalent to 15%. Generally, the thickness of the strained $Si_{1-x}Ge_x$ layer 404 depends on the ultimate device geometry. In one embodiment, to form a non-planar tri-gate transistor structure, the strained $Si_{1-x}Ge_x$ layer 404 may have the thickness in the approximate range of 15-25 nm and the intrinsic Si layer 405 may have the thickness in the approximate range between 3 nm to 15 nm. In another embodiment, the strained $Si_{1-x}Ge_x$ layer 404 may have the thickness about 20 nm. In yet another embodiment, to form, for example, a double-gate device, the strained $Si_{1-x}Ge_x$ layer 404 may be about 100 nm thick.

Figure 1C:
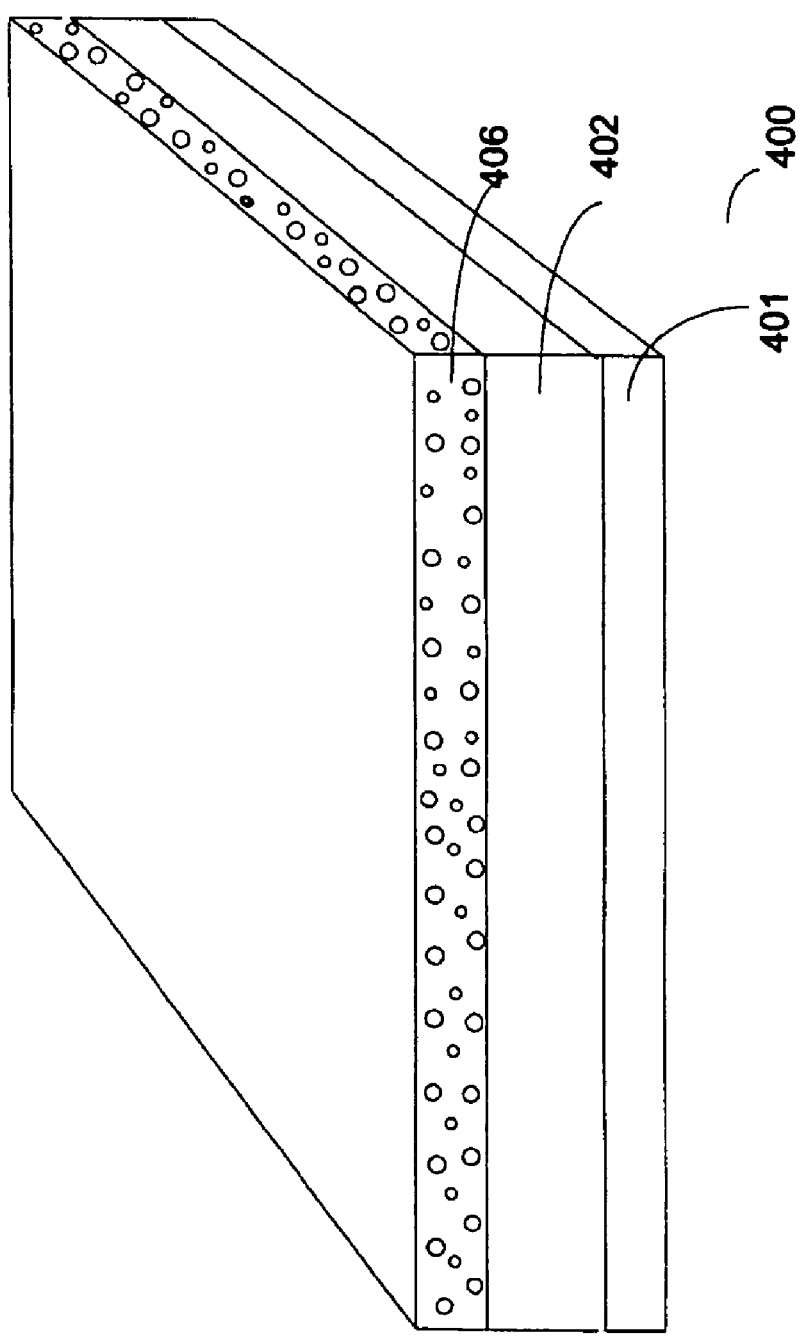
FIG. 1C is a view similar to FIG. 1B, after annealing to form a relaxed $Si_{1-x}Ge_x$ layer.

The heat treatment, or annealing, of the semiconductor structure 400 is carried out to reduce strain of the $Si_{1-x}Ge_x$ layer 404. Annealing results in diffusion of the Ge atoms from $Si_{1-x}Ge_x$ layer 404 into the underlying Si layer 403 and upper intrinsic Si layer 405, as illustrated in FIG. 1B. The diffusion of the Ge atoms relaxes the strain in the $Si_{1-x}Ge_x$ layer 404, such that the relaxed $Si_{1-x}Ge_x$ layer 406 is formed, as illustrated in FIG. 1C. In one embodiment, the annealing temperature to relax the strained $Si_{1-x}Ge_x$ layer 404 is in the approximate range of 1000 to 1100 C, and more specifically, about 1050 C.

FIG. 1C is a view of the semiconductor structure 400 after annealing. As shown in FIG. 1C, the semiconductor structure 400, after annealing, comprises a relaxed $Si_{1-x}Ge_x$ layer 406 formed from the strained $Si_{1-x}Ge_x$ layer 404, the Si layer 403 and the intrinsic Si layer 405. The relaxed $Si_{1-x}Ge_x$ layer 406 rests on top surface of the buried oxide layer 402 covering the silicon substrate 401. In one embodiment, the total thickness of the relaxed $Si_{1-x}Ge_x$ layer 406 may be in the approximate range of 20 nm to 100 nm.

Figure 1D:
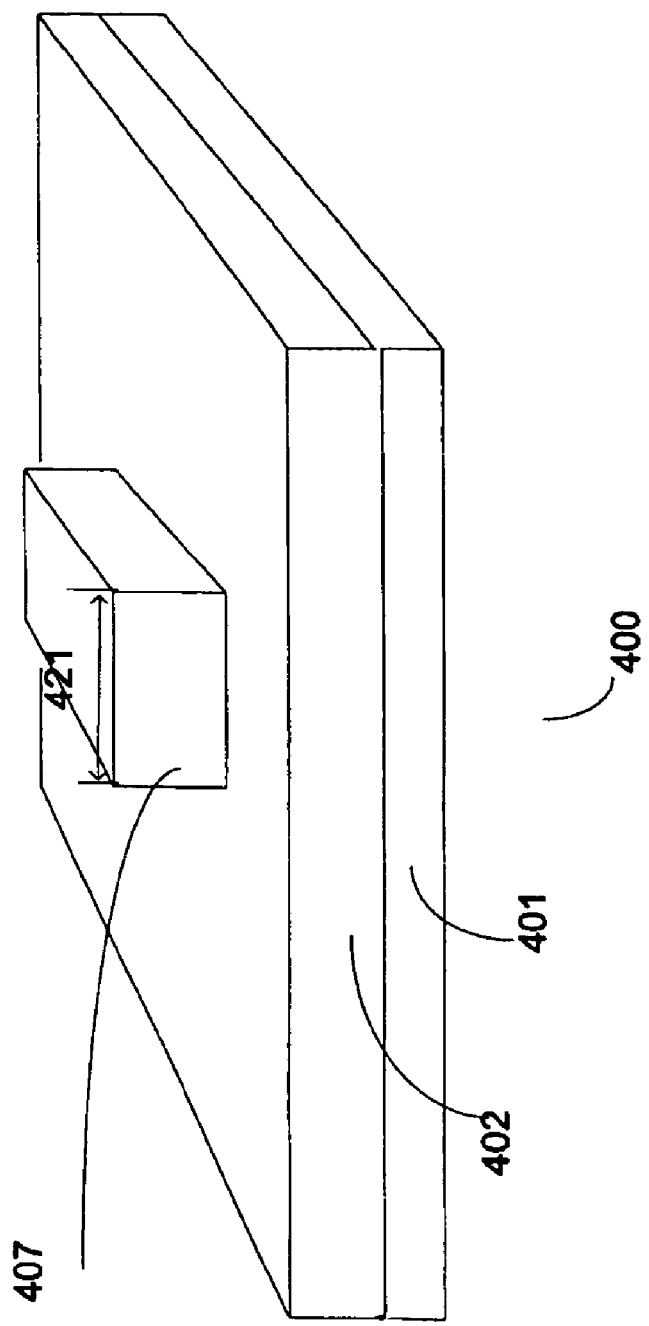
FIG. 1D is a view similar to FIG. 1C, after forming a tri-gate fin from the relaxed $Si_{1-x} Ge_x$ layer according to one embodiment of the invention.

The semiconductor structure 400 is patterned to expose portions of the relaxed $Si_{1-x}Ge_x$ layer 406. The exposed portions of the relaxed $Si_{1-x}Ge_x$ layer 406 are subsequently etched and removed so that tri-gate fins in the relaxed $Si_{1-x}Ge_x$ layer 406 are formed. FIG. 1D shows the semiconductor structure 400 with a tri-gate fin formed from relaxed $Si_{1-x}Ge_x$ layer on the oxide layer according to one embodiment of the invention. The tri-gate fin 407 stands above the insulating layer 402, the insulating layer 402 covers the Si substrate 401. In one embodiment, patterning of the relaxed $Si_{1-x}Ge_x$ layer 406 to form the tri-gate fin 407 may be performed by using a well known in the art photolithographic technique. Etching the portions of the relaxed $Si_{1-x}Ge_x$ layer 406 can be performed with an anisotropic etchant, which selectively removes the exposed portions of the relaxed $Si_{1-x}Ge_x$ layer 406 over the other exposed materials of the structure, generating the tri-gate fin 407 with vertical sidewalls. In one embodiment, the width 421 of the tri-gate fin 407 is in the approximate range of 20 nm to 120 nm.

Figure 1E:
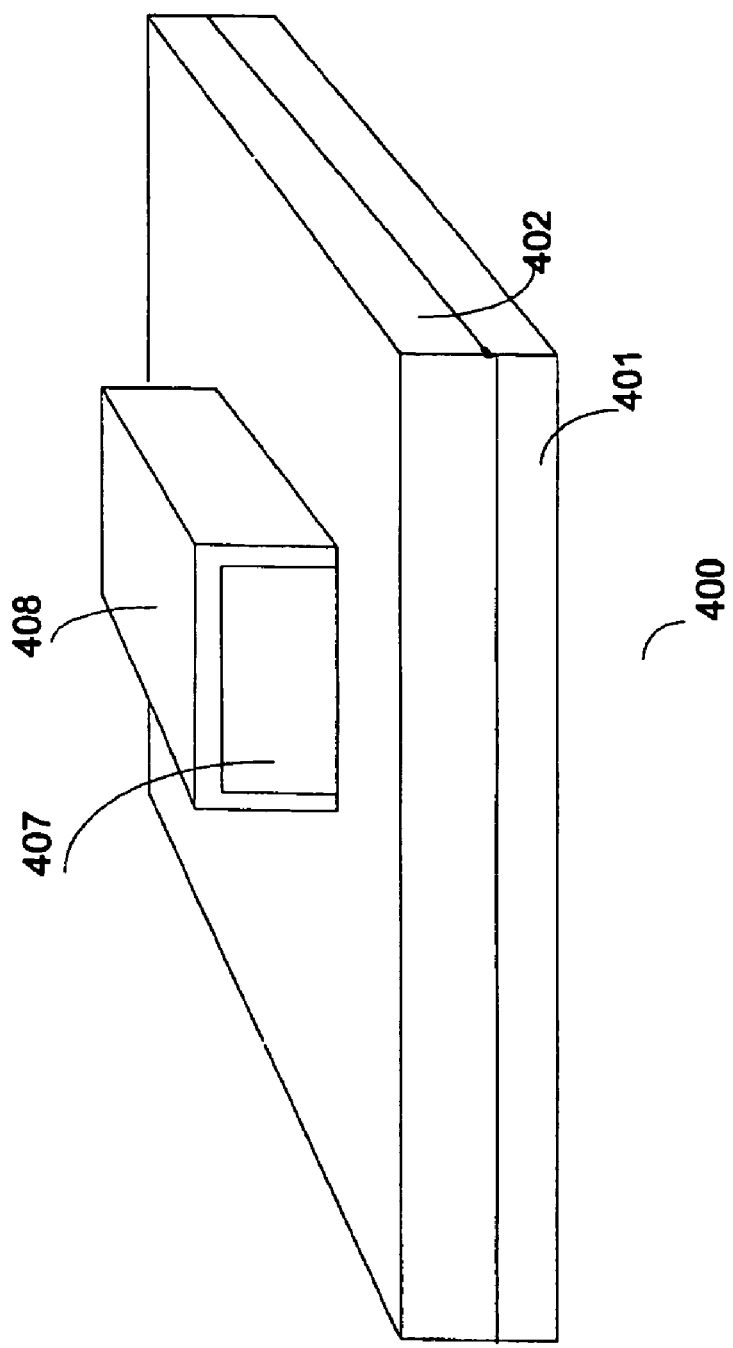
FIG. 1E is a view similar to FIG. 1D, after a strained $Si_{1-y} Ge_y$ layer is epitaxially formed on the relaxed $Si_{1-x} Ge_x$ tri-gate fin.

FIG. 1E illustrates a strained $Si_{1-y}Ge_y$ 408 selectively grown on the tri-gate fin 407. The strained $Si_{1-y}Ge_y$ layer 408 covers the top surface and two opposing sidewalls of the tri-gate fin 407, but does cover the insulating layer 402. Because the $Si_{1-y}Ge_y$ layer 408 has the same lattice structure as the relaxed $Si_{1-x}Ge_x$ layer 406 comprising the tri-gate fin 407, it can be epitaxially grown on the relaxed $Si_{1-x}Ge_x$ layer. In one embodiment, the $Si_{1-y}Ge_y$ layer, which is selectively grown by epitaxy on the relaxed $Si_{1-x}Ge_x$ tri-gate fin, has the Ge content y approximately from 0.10 to 0.50 (10% to 50%) higher than the Ge content x in the underlying relaxed $Si_{1-x}Ge_x$ fin. In another embodiment, the Ge content y of the $Si_{1-y}Ge_y$ layer epitaxially grown on the relaxed $Si_{1-0.15}Ge_{0.15}$ tri-gate fin is about 0.3 (30%) higher than the Ge content x in the underlying relaxed $Si_{1-x}Ge_x$ fin. In yet another embodiment, the Ge content y of the $Si_{1-y}Ge_y$ layer epitaxially grown on the relaxed $Si_{1-0.15}Ge_{0.15}$ tri-gate fin is about 0.3 (30%). Generally, the higher Ge content means larger lattice spacing of the $Si_{1-y}Ge_y$ layer relative to the relaxed $Si_{1-x}Ge_x$ layer. Larger lattice spacing creates compressive stress in the $Si_{1-y}Ge_y$ layer covering the top surface and two opposing sidewalls of the relaxed $Si_{1-x}Ge_x$ tri-gate fin. The compressive stress in the $Si_{1-y}Ge_y$ layer reduces the effective mass of the p-type carriers (holes) that substantially increases the hole mobility in a channel of the non-planar PMOS transistor, wherein the channel is formed in the strained $Si_{1-y}Ge_y$ layer 408. In one embodiment, the hole mobility enhancement factor in the channel formed in the strained $Si_{1-y}Ge_y$ layer 408 is in the approximate range of 1.2 to 5.

In one embodiment, the strained $Si_{1-y}Ge_y$ layer 408 may be epitaxially grown on the tri-gate fin 407 by a low pressure chemical vapour deposition (CVD) technique including Silane (SiH4) and Germane (GeH$_4$) gases. For another embodiment, the strained $Si_{1-y}Ge_y$ layer 408 may be epitaxially grown on the relaxed $Si_{1-x}Ge_x$ tri-gate fin 407 by a low pressure chemical vapour deposition (CVD) technique including DichloroSilane ($SiCl_2H_2$) and Germane (GeH$_4$) gases. In one embodiment, the pressure in the reactor may be in the approximate range of 1 torr to 400 torr and the temperature may be in the approximate range of 300 C to 900 C. In one embodiment, the thickness of the strained $Si_{1-y}$ $Ge_y$ layer selectively grown by epitaxy on the relaxed $Si_{1-x}Ge_x$ tri-gate fin is in the approximate range of 50 Å to 200 Å. More specifically, the thickness of the strained $Si_{1-y}Ge_y$ layer is about 100 Å. Further, a n-type dopant, for example, arsenic ("As"), phosphorus ("P"), and the like, is added to the relaxed $Si_{1-x}Ge_x$ tri-gate fin 407 covered by the strained $Si_{1-y}Ge_y$ layer 408 to form a n-well. The n-type dopant may be added by using, for example, the ion implantation technique. The concentration of the n-type dopants is in the approximate range of $2 \times 10^{16}$ cm$^{-3}$ to $2 \times 10^{19}$ cm$^{-3}$.

Figure 1F:
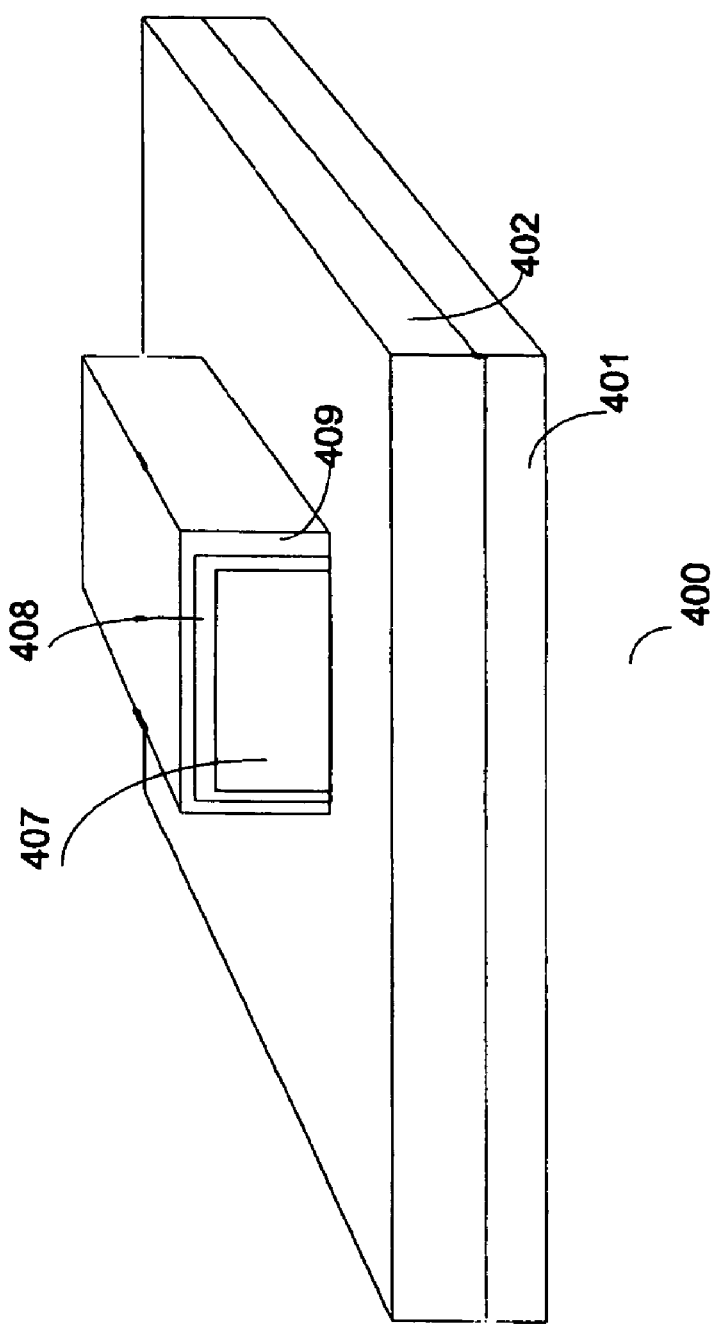
FIG. 1F is a cross-sectional view of the semiconductor structure after a high-k dielectric layer is formed on the strained $Si_{1-y} Ge_y$ tri-gate fin according to one embodiment of the invention.

As illustrated in FIG. 1F, a dielectric layer is formed on the strained $Si_{1-y}Ge_y$ layer. The dielectric layer 409 covers the top surface and two opposing sidewalls of the tri-gate fin 407 with the strained $Si_{1-y}Ge_y$ layer 408. The dielectric layer 409 forms a gate dielectric of the tri-gate transistor structure. In one embodiment, the dielectric layer 409 may be blanket deposited, patterned, and etched into the gate dielectric utilizing known photolithographic and etching techniques. In one embodiment, the dielectric layer may include oxide of a transition metal. In one embodiment, the dielectric layer 409 may include a high-k dielectric, for example, zirconium oxide("$ZrO_2$"). For alternative embodiments, the dielectric layer 409 may include of any one of a hafnium oxide ("$HFO_2$") and lanthanum oxide ("$La_2O_4$"). The thickness of the dielectric layer 409 may be between 10 Å and 40 Å.

Figure 1G:
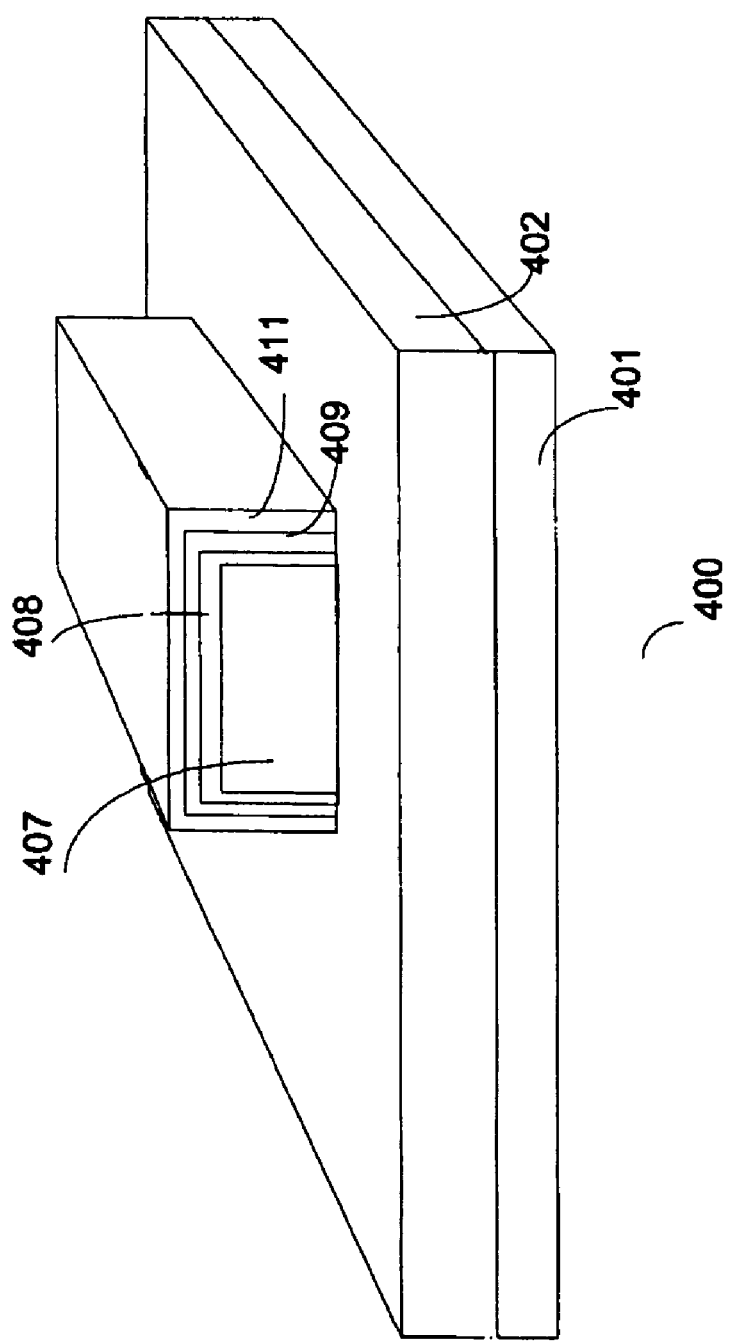
FIG. 1G is a cross-sectional view of the semiconductor structure after a tri-gate electrode is formed on the high-k dielectric layer according to one embodiment of the invention.

FIG. 1G is a cross-sectional view of the semiconductor structure 400 after a tri-gate electrode layer is formed on the high-k dielectric layer according to one embodiment of the invention. The tri-gate electrode layer 411 is formed on the dielectric layer 409 covering the top surface and the sidewalls of the tri-gate fin 407, as illustrated in FIG. 1G. In one embodiment, the thickness of the tri-gate electrode layer 411 is in the approximate range of 500 Å to 1500 Å. In one embodiment, the tri-gate electrode layer 411 may be formed by blanket deposition of polysilicon and patterning the polysilicon into the tri-gate electrode utilizing known photolithographic techniques. For an embodiment, the tri-gate electrode layer 411 and the underlying dielectric layer 409 may be subsequently patterned and etched to a predetermined width. In another embodiment, the tri-gate electrode layer 411 includes a metal underlayer under the polysilicon. In yet another embodiment, the tri-gate electrode layer 411 is a metal.

Figure 1H:
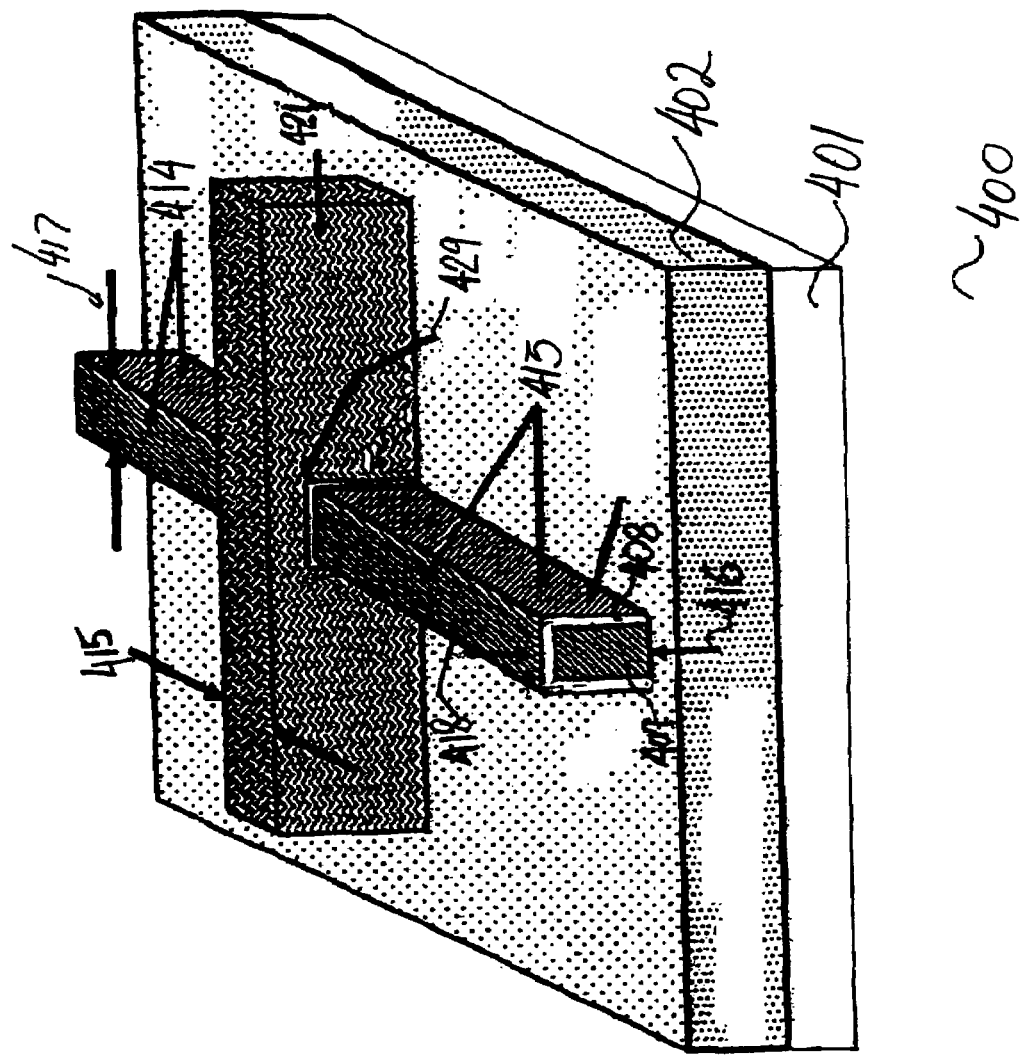
FIG. 1H is a perspective view of a tri-gate p-MOS semiconductor structure according to one embodiment of the invention.

FIG. 1H is a perspective view of a tri-gate p-MOS semiconductor structure 400 according to one embodiment of the invention. The structure 400 has a source region 413 and a drain region 414 formed in the fin structure ("fin body") 418 at opposite sides of the gate electrode 421. The gate electrode 421 with underlying dielectric 429 has a predetermined width 415 and covers a portion of the fin body 418. For an embodiment, the fin body 418 includes a tri-gate fin 407 formed from relaxed $Si_{1-x}Ge_x$ layer covered by the strained $Si_{1-y}Ge_y$ layer 408. The fin body 418 is formed on top surface of the insulating layer 402. The insulating layer 402 rests on the silicon substrate 401. In one embodiment, the width 415 of the gate electrode 421 is in the approximate range of 80 nm to 120 nm, the thickness 416 of the fin body 418 is in the approximate range of 20 nm to 120 nm, and the width 417 of the fin body 418 is in the approximate range of 20 nm to 120 nm. For an embodiment, to form the source region 413 and the drain region 414 of the p-MOS transistor structure 400, a p-type dopant, for example, boron ("B") is added to the fin body 418 at the opposite sides of the gate electrode 421, for example, by ion implantation. For an embodiment, the concentration of the p-type dopants is in the approximate range of $10^{18}$ cm$^{-3}$ to $10^{21}$ cm$^{-3}$.

Figure 2A:
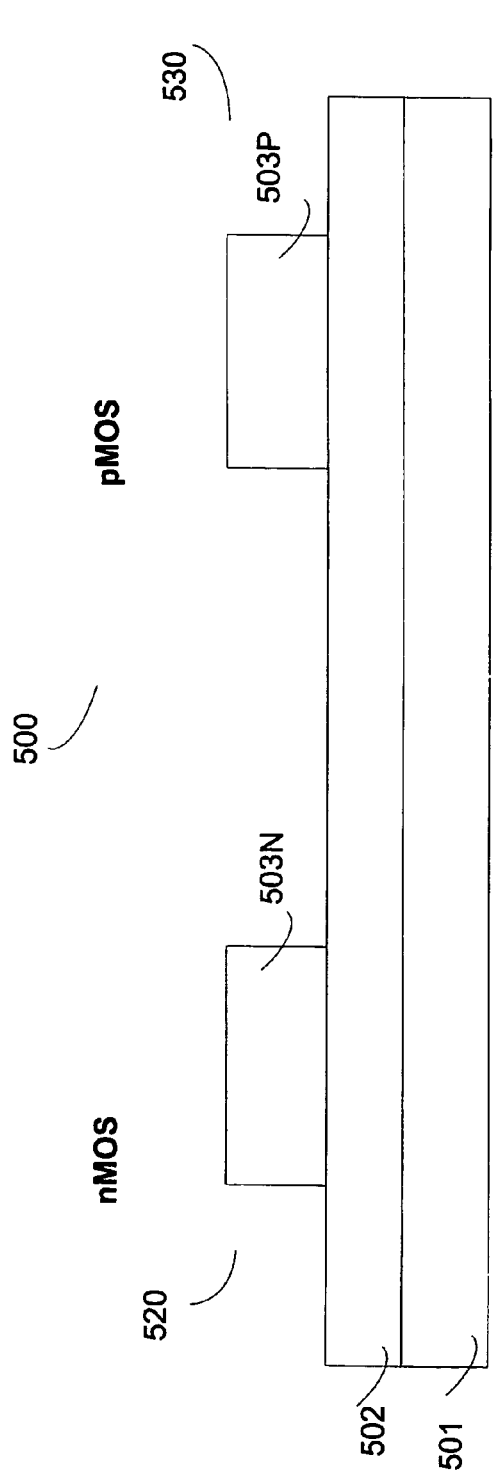
FIG. 2A is a cross-sectional side view of a semiconductor structure for a non-planar tri-gate CMOS fabrication with tri-gate fins according to one embodiment of the invention.

FIGS. 2A-2K illustrate an exemplary process to fabricate a strained non-planar tri-gate CMOS structure, according to one embodiment of the invention. FIG. 2A illustrates a cross-sectional view of the semiconductor structure 500 for tri-gate CMOS fabrication with two tri-gate fins 503N and 503P formed from a relaxed $Si_{1-x}Ge_x$ layer. As shown in FIG. 2A, the tri-gate fins 503N and 503P formed from a relaxed $Si_{1-x}Ge_x$ layer are located on an oxide layer 502, which covers a Si substrate 501. One of the tri-gate fins 503N belongs to an n-MOS portion 520 of the semiconductor structure, whereas the other tri-gate fin 503P belongs to a p-MOS portion 530 of the CMOS structure. Semiconductor structure 500 having tri-gate fins 503N and 503P formed from the relaxed $Si_{1-x}Ge_x$ layer may be fabricated using the process described presently. Next, before forming the p-MOS portion 530, the n-MOS portion 520 is covered by a first protection layer to protect the n-MOS portion during p-MOS portion formation.

Figure 2B:
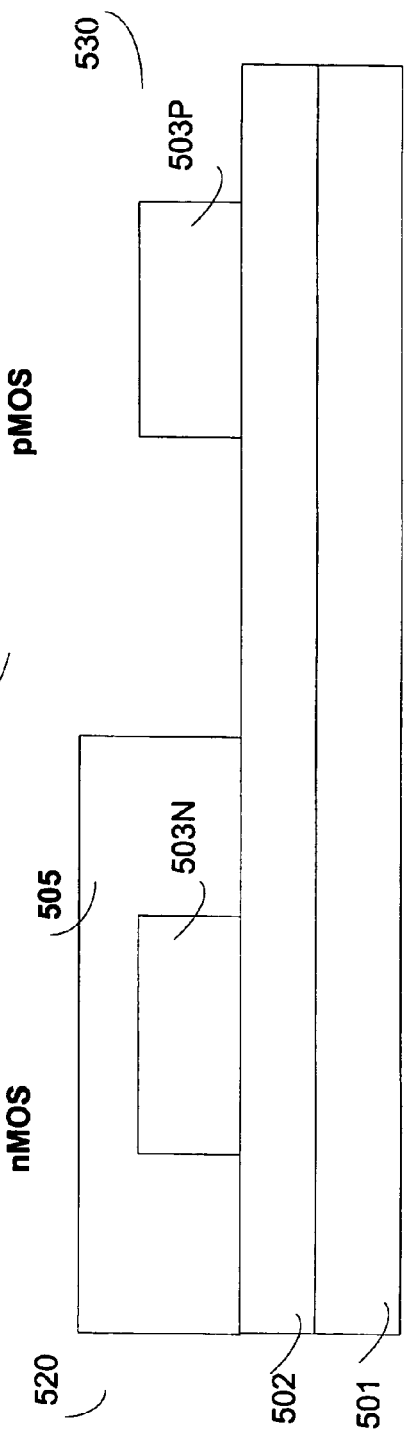
FIG. 2B is a view similar to FIG. 2A, after covering an n-MOS portion of the semiconductor structure by a protection layer, leaving a p-MOS portion exposed.

FIG. 2B is a cross-sectional view of the semiconductor structure 500 after covering the n-MOS portion by a first protection layer. The p-MOS portion 530 of the structure 500 is uncovered, while the first protection layer 505 covers the top surface and sidewalls of the tri-gate fin 503N that belongs to the n-MOS portion 520. For an embodiment, the first protection layer 505 may be formed, for example, by depositing a silicon nitride ("$Si_3N_4$") layer on the wafer, forming a resist on the $Si_3N_4$ layer, patterning the resist to expose portions of the $Si_3N_4$ layer covering the p-MOS portion 530, etching the silicon nitride layer on the p-MOS portion 530 to expose p-MOS portion 530, and then ashing the resist producing the structure in FIG. 2B. In alternative embodiments, other implant mask materials may be used as a first protection layer 505. Next, to form a strained channel in the p-MOS portion 530 of the semiconductor structure 500, a strained $Si_{1-y}Ge_y$ layer is selectively formed on the tri-gate fin 503P of the p-MOS portion 530.

Figure 2C:
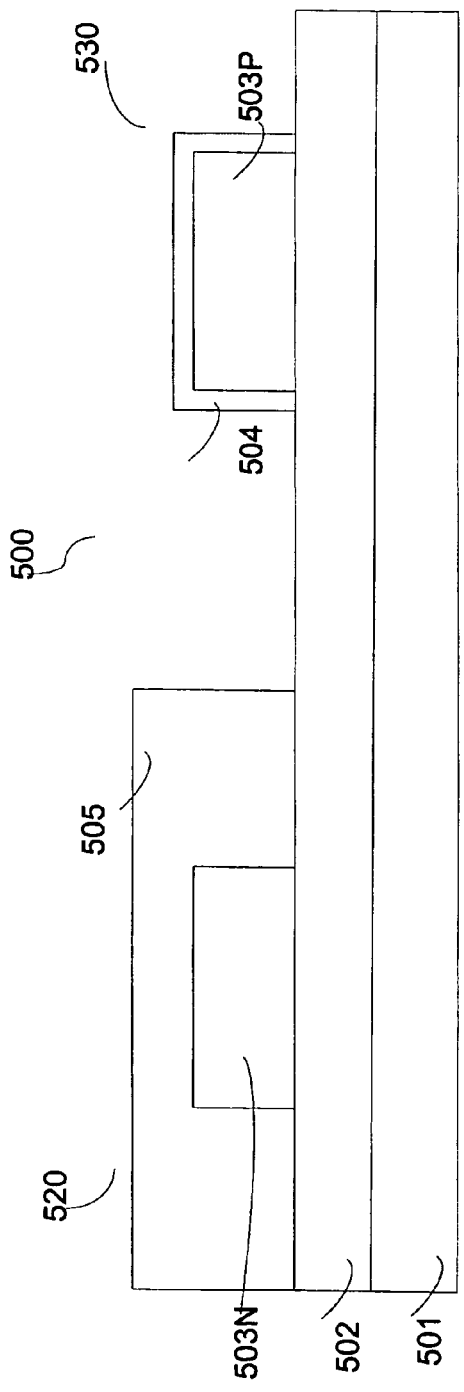
FIG. 2C is a view similar to FIG. 2B, after epitaxially forming a strained $Si_{1-y} Ge_y$ layer on a tri-gate fin of the p-MOS portion of the semiconductor structure.

FIG. 2C shows a cross-sectional view of the semiconductor structure 500 after epitaxially forming a strained $Si_{1-y}Ge_y$ layer on the tri-gate fin of the p-MOS portion. The n-MOS portion 520 is covered by the first protection layer 505. The strained $Si_{1-y}Ge_y$ layer 504 covers the top surface and two opposing sidewalls of the tri-gate fin 503P of the p-MOS portion 530 of the structure 500 leaving the oxide layer 502 uncovered. In one embodiment, the strained $Si_{1-y}Ge_y$ layer 504 is selectively epitaxially grown on the top surface and two opposing sidewalls of the tri-gate fin 503P of the p-MOS portion 530. More specifically, the strained $Si_{1-y}Ge_y$ layer 504 is grown by low pressure CVD technique with a flow including $SiH_4$ and $GeH_4$ gases. For another embodiment, the strained $Si_{1-y}Ge_y$ layer 504 may be epitaxially grown by a low-pressure chemical vapour CVD with a flow including of $SiCl_2H_2$ and $GeH_4$ gases. The pressure in the reactor may be in the approximate range of 1 torr to 400 torr and the temperature may be in the approximate range of 300 C to 900 C.

The strained $Si_{1-y}Ge_y$ layer 504 has a Ge content y approximately 15% higher than the Ge content x of the relaxed $Si_{1-x}Ge_x$ layer of the tri-gate fin 503P and a lattice spacing substantially larger than the lattice spacing of the $Si_{1-x}Ge_x$ layer of the tri-gate fin 503P that results in a compressive stress in the strained $Si_{1-y}Ge_y$ layer 504 along the top surface and two opposing sidewalls of the tri-gate fin 503P of the p-MOS portion 530. In one embodiment, the strained $Si_{1-y}Ge_y$ layer 504 has the Ge content y about 10% to 50% higher than the relaxed $Si_{1-x}Ge_x$ layer of the tri-gate fin 503P. In one embodiment, the strained $Si_{1-y}Ge_y$ layer 504 has the Ge content y about 0.3 (30%) and the relaxed $Si_{1-x}Ge_x$ layer of the tri-gate fin 503P has the Ge content x of about 0.15 (15%). The compressive stress increases the hole mobility in the strained $Si_{1-y}Ge_y$ layer 504. In one embodiment, the hole mobility enhancement factor in the channel formed in the strained $Si_{1-y}Ge_y$ layer 408 is in the approximate range of 1.2 to 5. In one embodiment, the thickness of the strained $Si_{1-y}Ge_y$ layer 504 is in the approximate range of 50 Å to 200 Å, and more specifically, about 100 Å. Further, to form a n-well, a n-type dopant is added to the tri-gate fin 503N covered by the strained $Si_{1-y}Ge_y$ layer 504. The n-type dopant may be any one of As, P, and the like. The n-type dopant may be added, for example, by the ion implantation technique. For an embodiment, the concentration of the dopants is in the approximate range of $2\times10^{17}$ $cm^{-3}$ to $2\times10^{19}$ $cm^{-3}$. In one embodiment, before the ion implantation, the strained $Si_{1-y}Ge_y$ layer 504 may be covered by a second protection layer to protect the surface of the strained $Si_{1-y}Ge_y$ layer 504 from unnecessary damage.

Figure 2D:
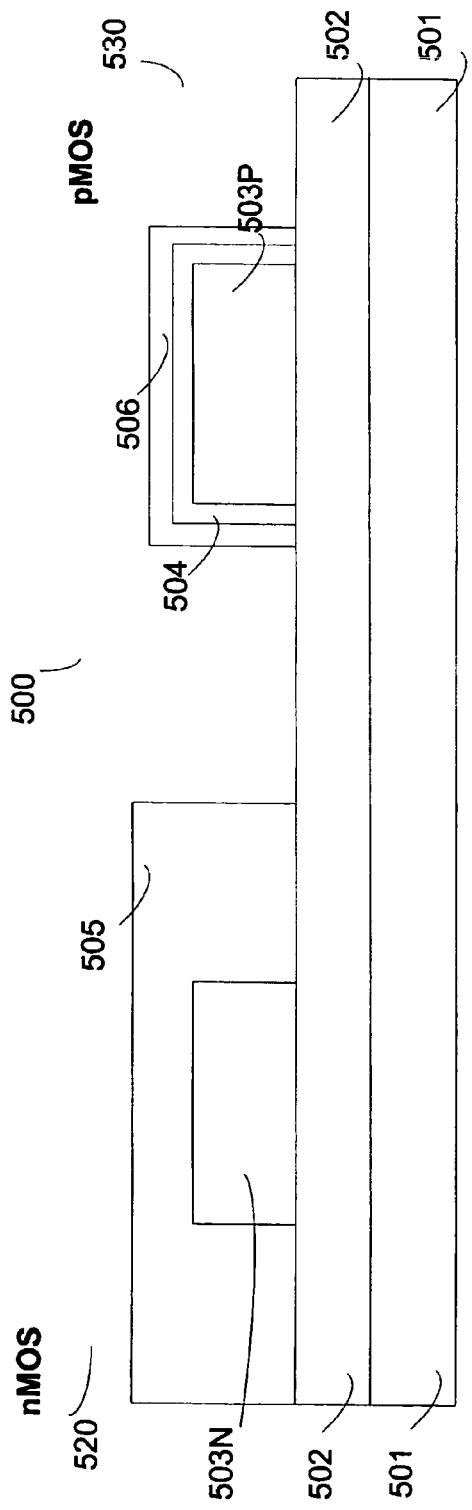
FIG. 2D is a view similar to FIG. 2C, after a protection oxide layer is formed on the strained $Si_{1-y} Ge_y$ layer covering the tri-gate fin of the p-MOS portion of the semiconductor structure.

FIG. 2D is a cross-sectional view of the semiconductor structure 500 having a second protection layer 506 formed on the strained $Si_{1-y}Ge_y$ layer. The second protection layer 506 is deposited on the strained $Si_{1-y}Ge_y$ layer 504 along the top surface and two opposing sidewalls of the tri-gate fin 503P of the p-MOS portion 530. For an embodiment, the second protection layer 506 may be a silicon oxide layer formed by the epitaxial growth and the subsequent oxidation of silicon. For another embodiment, the second protection layer 506 may be a second silicon nitride layer formed by patterning and etching technique, which is known to one of ordinary skill in the art of semiconductor fabrication. For example, the protection layer 506 may be formed by repeating the deposition of silicon nitride layer on the wafer, lithographically patterning the silicon nitride layer to leave a resist on the p-MOS portion 530, etching the silicon nitride layer off the n-MOS portion 520, and then stripping off the resist.

The second protection layer 506 also protects the p-MOS portion 530 from, for example, unnecessary deposition of Si during the strained channel formation at the n-MOS portion 520 of the semiconductor structure 500. The thickness of the second protection layer 506 may be in the approximate range of 30 Å to 100 Å. Next, to form a n-MOS portion, the first protection layer 505 is removed from the n-MOS portion 520 of the semiconductor structure 500.

FIG. 2E is a cross-sectional view of the semiconductor structure 500, after removing the first protection layer 505 from the n-MOS portion of the semiconductor structure 500. For an embodiment, the first protection layer 505 may be removed by, for example, wet etching using a hot phosphoric acid. Further, to form a strained channel, the strained Si layer is epitaxially grown on the tri-gate fin 503N of the n-MOS portion 520.

FIG. 2F is a cross-sectional view of the semiconductor structure after forming a strained Si layer on the tri-gate fin of the n-MOS portion. The strained Si layer 507 covers the top surface and two opposing sidewalls of the fin tri-gate 503N of the n-MOS portion 520 of the semiconductor structure 500 and does not cover the oxide layer 502. For an embodiment, the strained Si layer 507 may be formed by the epitaxy. Because of presence of Ge atoms, the $Si_{1-x}Ge_x$ layer of the tri-gate fin 503N has substantially larger lattice spacing, than the lattice spacing of the Si layer, resulting in a tensile strain in the Si layer along the top surface and two opposing sidewalls of the tri-gate fin 503N of the n-MOS portion 520. The tensile strain increases the electron mobility in the strained Si layer 507 of the n-MOS portion 520 of the semiconductor structure 500. In one embodiment, the electron mobility enhancement factor in the channel formed in the strained Si layer 507 is in the approximate range of 1.2 to 5. In one embodiment, the thickness of the strained Si layer 507 is in the approximate range of 50 Å to 200 Å, and more specifically, about 100 Å.

Further, a p-well is formed in the n-MOS portion 520. For an embodiment, to form a p-well, a p-type dopant, for example, B, and the like, is added to the tri-gate fin 503N covered by the strained Si layer 507 by the ion implantation technique. For an embodiment, before the ion implantation, to protect the surface of the channel during the ion implantation, the pad oxide layer is formed on the strained Si layer, covering the top surface and two opposing sidewalls of the tri-gate fin 503N. The concentration of p-dopants is in the approximate range of $2\times10^{17}$ $cm^{-3}$ to $2\times10^{19}$ $cm^{-3}$.

Figure 2G:
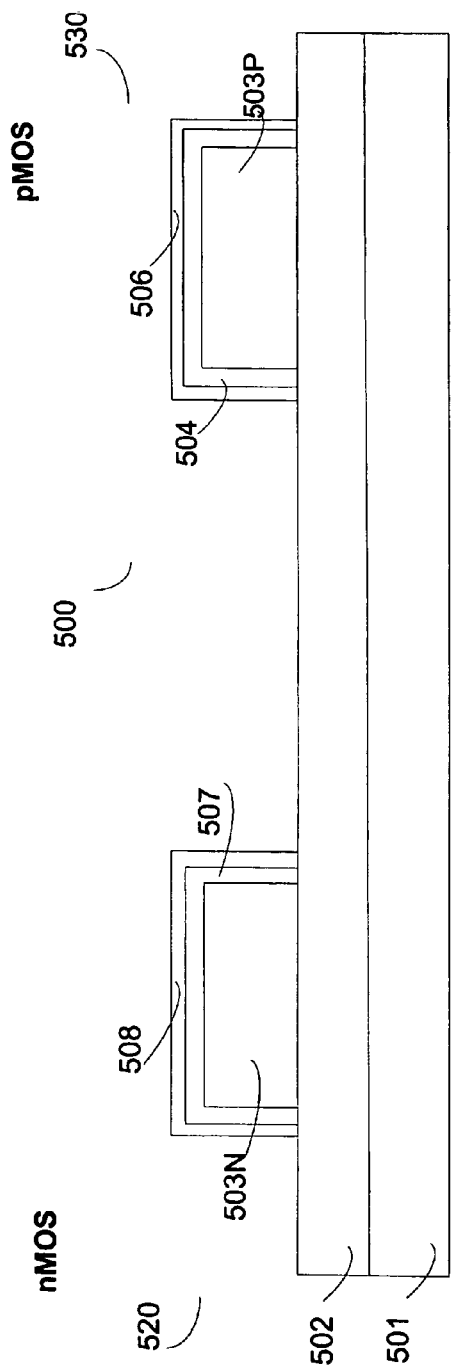
FIG. 2G is a view similar to FIG. 2F, after forming a protection pad oxide layer on the strained Si layer covering the tri-gate fin of the n-MOS portion of the semiconductor structure.

FIG. 2G is a cross-sectional view of the semiconductor structure 500 after forming a pad oxide layer. The pad oxide layer 508 is formed on the strained Si layer 507 covering the tri-gate fin 503N of the n-MOS portion 530. The pad oxide layer 508 covers the strained Si layer 507 along the top surface and two opposing sidewalls of the tri-gate fin 503N. In one embodiment, the pad oxide layer 508 is a silicon oxide. Next, the second protection layer 506 and the pad oxide layer 508 are removed from the n-MOS portion 520 and the p-MOS 530 portion, respectively.

Figure 2H:
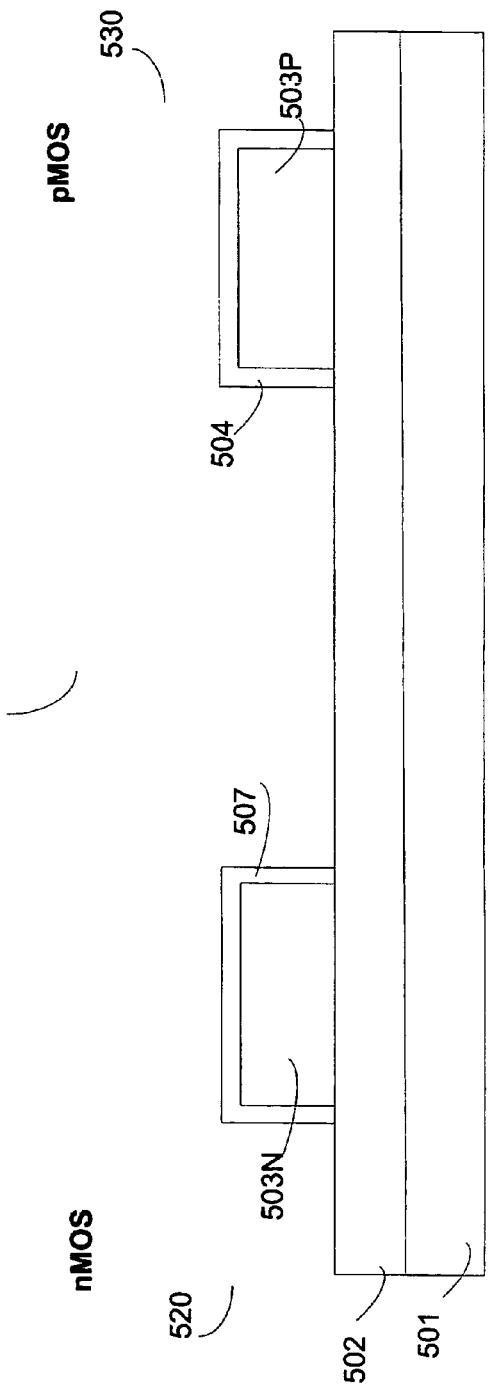
FIG. 2H is a view similar to FIG. 2G, after removing the protection oxide layers from the n-MOS and p-MOS portions of the semiconductor structure.

FIG. 2H is a cross-sectional view of the semiconductor structure 500 after removing the oxide layers from the n-MOS and p-MOS portions. In one embodiment, the second protection layer 506 and the pad oxide layer 508 may be removed by, for example, wet etching. Next, a dielectric layer is formed on the strained Si and $Si_{1-y}Ge_y$ layers.

Figure 2I:
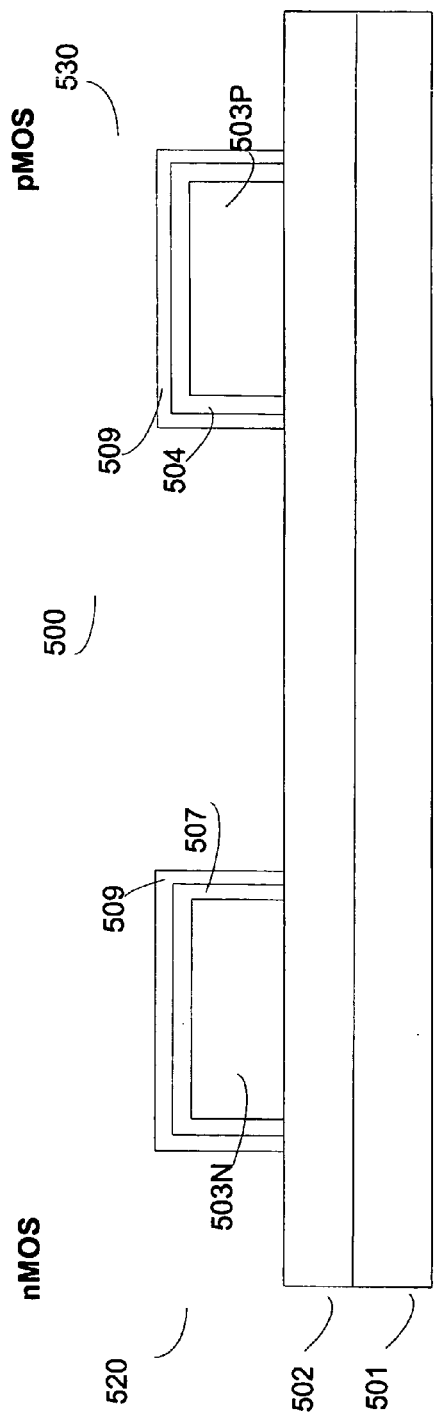
FIG. 2I is a view similar to FIG. 2H, after forming a high-k dielectric layer on the strained Si layer and $Si_{1-y} Ge_y$ layer.

FIG. 2I is a cross-sectional view of semiconductor structure 500 after forming a dielectric layer on the strained Si layer and $Si_{1-y}Ge_y$ layer, which respectively covers the tri-gate fins of each of the n-MOS and p-MOS portions. The dielectric layer 509 is deposited on the strained Si layer 507 and the strained $Si_{1-y}Ge_y$ layer 504, covering the top surface and two opposing sidewalls of the tri-gate fins 503N and 503P of the n-MOS portion 520 and the p-MOS 530 portion respectively, as illustrated in FIG. 21. In one embodiment, the dielectric layer 509 may be blanket deposited, patterned, and etched into the gate dielectric using known photolithographic and etching techniques. For an embodiment, the dielectric layer 509 is a high-k dielectric. For an embodiment, the dielectric layer 509 may include an oxide For another embodiment, the dielectric layer 509 may include an oxide of transition metal. For alternative embodiments, the dielectric layer 509 may be made of $ZrO_2$, $HFO_2$, or $La_2O_5$ or any combination thereof. For an embodiment, the dielectric layer 509 may be formed to the thickness in the approximate range of 10 Å to 40 Å. Next, the tri-gate electrode layer is formed on the dielectric layer 509.

Figure 2J:
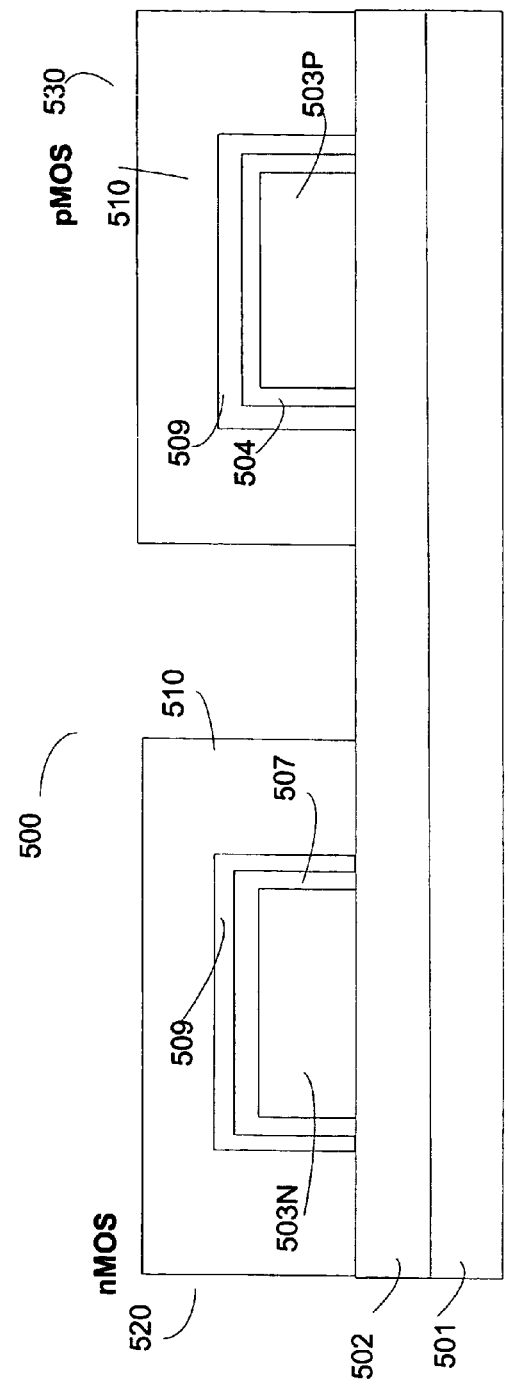
FIG. 2J is a view similar to FIG. 2I, after forming a tri-gate gate electrode on the high-k dielectric layer.

FIG. 2J is a cross-sectional view of the semiconductor structure 500, after forming a tri-gate electrode layer. The tri-gate electrode layer 510 is formed on the gate dielectric layer 509 covering the top surface and two opposing sidewalls of each of the tri-gate fins 503N and 503P of the n-MOS 520 portion and the p-MOS portion 530. For an embodiment, the thickness of the tri-gate electrode layer 510 is in the approximate range of 500 Å to 1500 Å. For an embodiment, the tri-gate electrode layer 510 may be formed by blanket deposition of polysilicon. Then, the tri-gate electrode layer 510 may be patterned and etched into the tri-gate electrode using known in the art photolithographic and etching techniques. For an embodiment, the tri-gate electrode layer 510 with the underlying dielectric layer 509 are patterned and etched to a predetermined width.

Figure 2K:
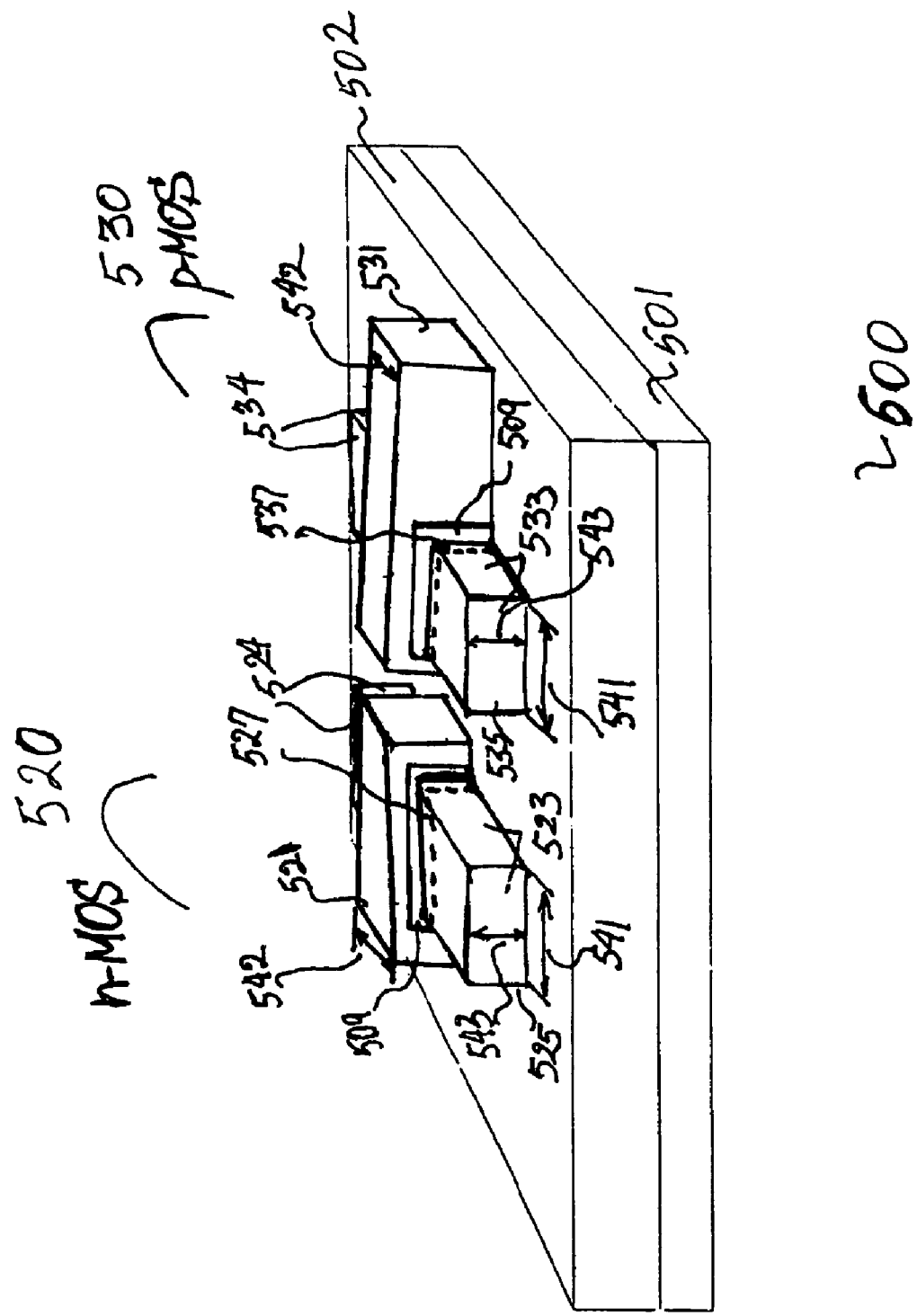
FIG. 2K is a perspective view of the strained CMOS structure according to one embodiment of the invention.

FIG. 2K is a perspective view of the non-planar tri-gate CMOS structure 600 according to one embodiment of the invention. The CMOS structure 600 has the n-MOS portion 520 and the p-MOS portion 530. The n-MOS portion 520 has a source region 523 and a drain region 524 formed in the portions of n-MOS fin structure ("n-MOS fin body") 525 at opposite sides of the gate electrode 521. The n-MOS gate electrode 521 with the underlying dielectric layer 509 has the width 542 and covers the top surface and two opposing sidewalls of the n-MOS fin body 525. The n-MOS fin body 525 is formed on top surface of the oxide layer 502. The oxide layer 502 covers the silicon substrate 501. For an embodiment, the n-MOS fin body 525 includes a relaxed $Si_{1-x} Ge_x$ layer covered by the tensile strained Si layer. A strained channel of the n-MOS portion 527 is formed in the tensile strained Si layer under the dielectric layer 509 along the top surface and the two opposing sidewalls of the fin body 525. For an embodiment, to form the source region 523 and the drain region 524 of the n-MOS portion of the CMOS structure, a n-type dopant, for example, arsenic ("As") is added into the fin body 525 on the opposite sides of the gate electrode 521 on the n-MOS portion 520 of the CMOS structure 600. The n-type dopant may be added by, for example, the ion implantation. For an embodiment, the concentration of n-dopants maybe in the approximate range of $10^{18}$ cm$^{-3}$ to $10^{21}$ cm$^{-3}$.

The p-MOS portion 530 has a source region 533 and a drain region 534 formed in the p-MOS fin body 535 on opposite sides of the gate electrode 531. The p-MOS gate electrode 531 with underlying dielectric layer 509 has the predetermined width 542 and covers the top surface and the two opposing sidewalls of the p-MOS fin body 535. The p-MOS fin body 535 is formed on top surface of the oxide layer 502. The oxide layer 502 covers the silicon substrate 501. For an embodiment, the p-MOS fin body 535 of the p-MOS portion includes the relaxed $Si_{1-x} Ge_x$ layer, wherein the top surface and two opposing sidewalls of the relaxed $Si_{1-x} Ge_x$ layer are covered by the compressively strained $Si_{1-y} Ge_y$ layer. A strained channel 537 of the p-MOS portion 530 is formed in the compressively strained $Si_{1-y} Ge_y$ layer under the gate dielectric layer 509 along the top surface and the two opposing sidewalls of the p-MOS fin body 535. For an embodiment, to form the p-MOS source region 533 and the p-MOS drain region 534 of the CMOS structure 600, a p-type dopant, for example, boron ("B") is added into the p-MOS fin body 535 at the opposite sides of the gate electrode 531 on the p-MOS portion 530 of the CMOS structure 600. The p-type dopant may be added by, for example, the ion implantation. For an embodiment, the concentration of p-dopants may be in the approximate range of $10^{18}$ cm$^{-3}$ to $10^{21}$ cm$^{-3}$.

For an embodiment, the width 542 of the n-MOS tri-gate electrode 521 and the p-MOS tri-gate electrode 531 with the underlying dielectric 509 may be in the approximate range of 30 nm to 120 nm each. The width 541 of the n-MOS fin body 525 and the p-MOS fin body 535 may be in the approximate range of 30 nm to 120 nm each. The thickness 543 of the n-MOS fin body 525 and the p-MOS fin body 535 may be in the approximate range of 20 nm to 120 nm each.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. It may, for example, be possible to create similar structures utilizing materials other than Si and SiGe.

What is claimed is:

1. A method of forming a semiconductor structure, comprising:
    forming an insulating layer;
    forming a first layer that includes a first germanium content on the insulating layer, the first layer having a first lattice spacing, wherein the forming the first layer comprises
        forming a third layer having a third germanium content over the insulating layer,
        and forming a silicon layer on the third layer;
    forming a fin having a top surface and opposing sidewalls from the first layer; and
    forming a second layer that includes a second germanium content on the fin, wherein the second layer covers the top surface and the opposing sidewalls of the fin and has a second lattice spacing, which is larger than the first lattice spacing.

2. The method of claim 1, further comprising:
    forming a gate dielectric layer on the second layer;
    forming a gate electrode on the gate dielectric layer; and
    forming a source region and a drain region on opposing sides of the gate electrode.

3. The method of claim 1, wherein forming the second layer on the fin comprises an epitaxial growth.

4. The method of claim 1, wherein the second layer covering the fin is under compressive stress.

5. The method of claim 1, wherein the first layer is a relaxed SiGe layer and the second layer is a compressively strained SiGe layer.

6. A method of forming a semiconductor transistor structure, comprising:
    forming a first layer that includes a first germanium content on an insulating layer on a substrate, the first layer having a first lattice spacing, wherein the forming the first layer comprises
        forming a third layer having a third germanium content over the insulating layer,
        and forming a silicon layer on the third layer;
    forming a first and a second fin from the first layer, the first fin being on a first portion and the second fin being on a second portion of a semiconductor transistor structure;
    protecting a first portion of the semiconductor transistor structure with a first protective layer;
    forming a second layer that includes a second germanium content having a second lattice spacing substantially larger than the first lattice spacing on the second fin;
    removing the first protective layer from the first portion of the semiconductor transistor structure and protecting the second portion of the semiconductor transistor structure with a second protective layer; and
    forming a fourth layer of a third material having a third lattice spacing substantially smaller than the first lattice spacing on the first fin.

7. The method of claim 6, further comprising:
    forming gate dielectrics on the second layer and on the fourth layer of the third material;
    forming gate electrodes on each of the gate dielectrics; and
    forming a source region and a drain region at opposing sides of each of the first and the second gate electrodes.

8. The method of claim 6, wherein the second layer comprises silicon germanium and the third material comprises silicon.

9. The method of claim 6, wherein forming the second layer and the fourth layer comprises epitaxial growth.

10. The method of claim 9, wherein the second layer covers a top and two opposing sidewalls of the second fin and the fourth layer covers a top and two opposing sidewalls of the first fin.

* * * * *